(12) United States Patent
Yamaguchi

(10) Patent No.: US 12,009,378 B2
(45) Date of Patent: Jun. 11, 2024

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventor: Tetsuya Yamaguchi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 410 days.

(21) Appl. No.: 17/250,237

(22) PCT Filed: Apr. 3, 2019

(86) PCT No.: PCT/JP2019/014799
§ 371 (c)(1),
(2) Date: Dec. 21, 2020

(87) PCT Pub. No.: WO2020/003681
PCT Pub. Date: Jan. 2, 2020

(65) Prior Publication Data
US 2021/0126031 A1    Apr. 29, 2021

(30) Foreign Application Priority Data
Jun. 29, 2018   (JP) ................. 2018-124550

(51) Int. Cl.
*H01L 27/146* (2006.01)
*H04N 25/70* (2023.01)
(52) U.S. Cl.
CPC .. *H01L 27/14621* (2013.01); *H01L 27/14627* (2013.01); *H04N 25/70* (2023.01)

(58) Field of Classification Search
None
See application file for complete search history.

(56) References Cited

U.S. PATENT DOCUMENTS 8,558,338 B2 * 10/2013 Tsuji ................. H01L 27/14627
257/E31.127
2012/0268631 A1 * 10/2012 Takase ................. G02B 3/0068
257/E31.127

(Continued)

FOREIGN PATENT DOCUMENTS

CN         106796942 A    5/2017
JP        2012-227476 A   11/2012

(Continued)

OTHER PUBLICATIONS

International Search Report and Written Opinion of PCT Application No. PCT/JP2019/014799, dated Jul. 9, 2019, 10 pages of ISRWO.

*Primary Examiner* — Ali Naraghi
(74) *Attorney, Agent, or Firm* — CHIP LAW GROUP

(57) ABSTRACT

To provide a solid-state imaging device capable of improving image quality and an electronic apparatus equipped with the solid-state imaging device. There is provided a solid-state imaging device including a pixel array unit in which a plurality of pixels is one-dimensionally or two-dimensionally arrayed, the pixel array unit including a color filter and a semiconductor substrate for each pixel, a partition layer being formed between the color filters, the partition layer having a first width and a second width in order from a light incident side, the first width and the second width being different, and the second width being larger than the first width, and there is further provided an electronic apparatus equipped with the solid-state imaging device.

7 Claims, 14 Drawing Sheets

(56) References Cited

U.S. PATENT DOCUMENTS

| | | | | |
|---|---|---|---|---|
| 2013/0017641 A1* | 1/2013 | Goda | ................ | H05B 33/10 |
| | | | | 257/E33.013 |
| 2017/0287962 A1* | 10/2017 | Ootsuka | ............ | H01L 27/1463 |
| 2017/0338265 A1* | 11/2017 | Yoshiba | ............... | H04N 25/77 |
| 2018/0254294 A1* | 9/2018 | Cheng | ............... | H01L 27/1464 |
| 2018/0301491 A1 | 10/2018 | Nakamoto et al. | | |

FOREIGN PATENT DOCUMENTS

| | | |
|---|---|---|
| JP | 2016-063171 A | 4/2016 |
| JP | 2016-225324 A | 12/2016 |
| JP | 2017-011207 A | 1/2017 |
| WO | 2015/063965 A1 | 5/2015 |
| WO | 2016/052249 A1 | 4/2016 |
| WO | 2017/073321 A1 | 5/2017 |
| WO | 2017/187855 A1 | 11/2017 |

* cited by examiner

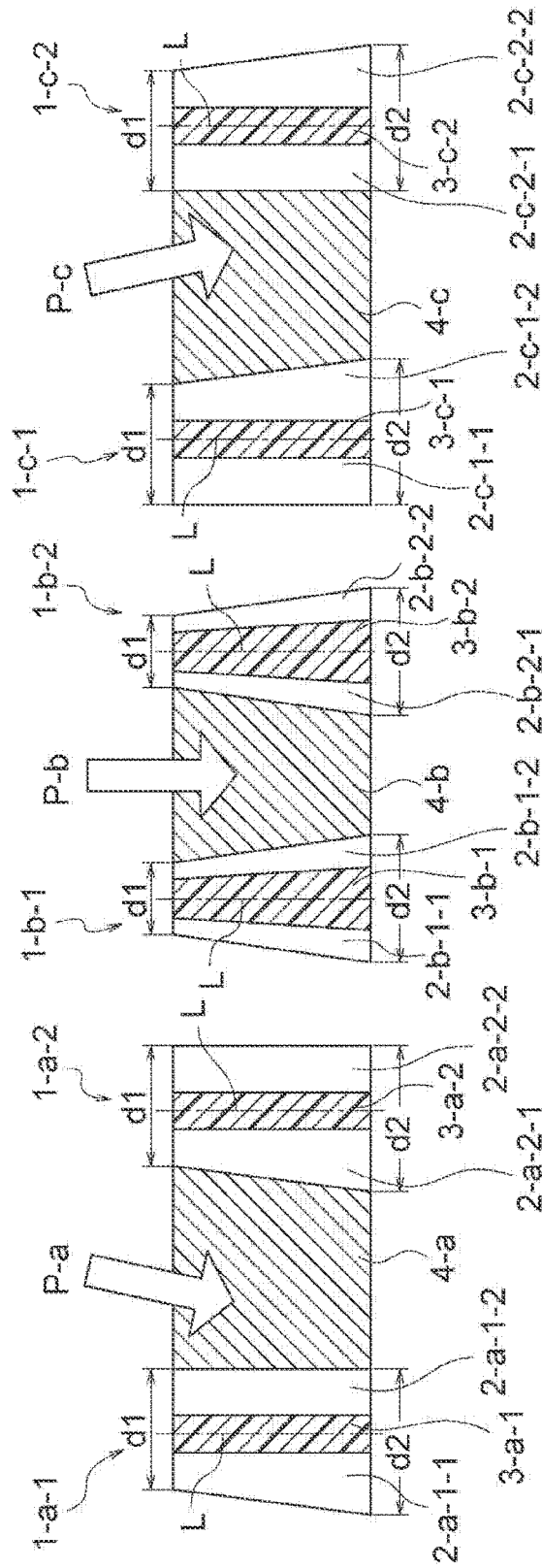

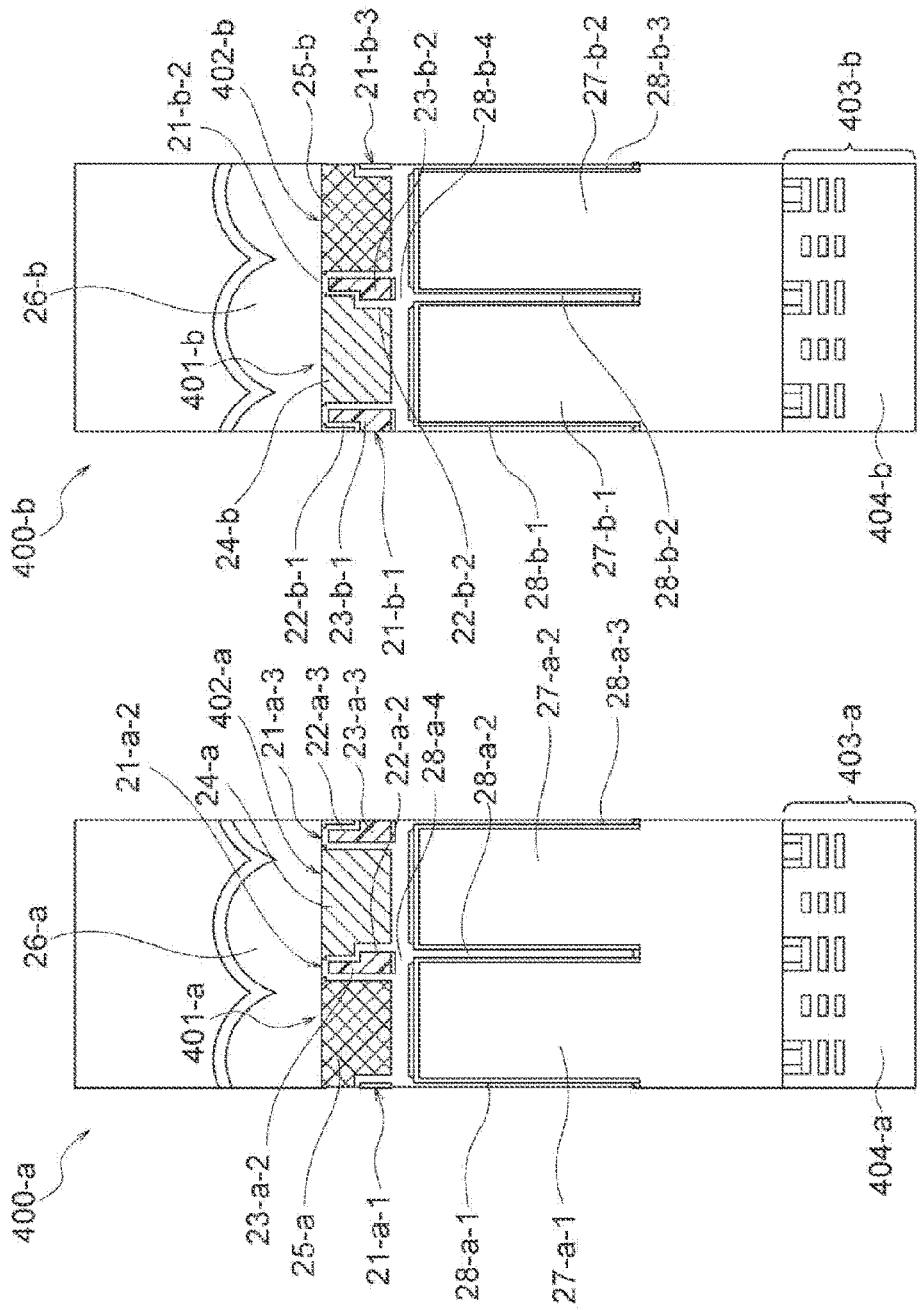

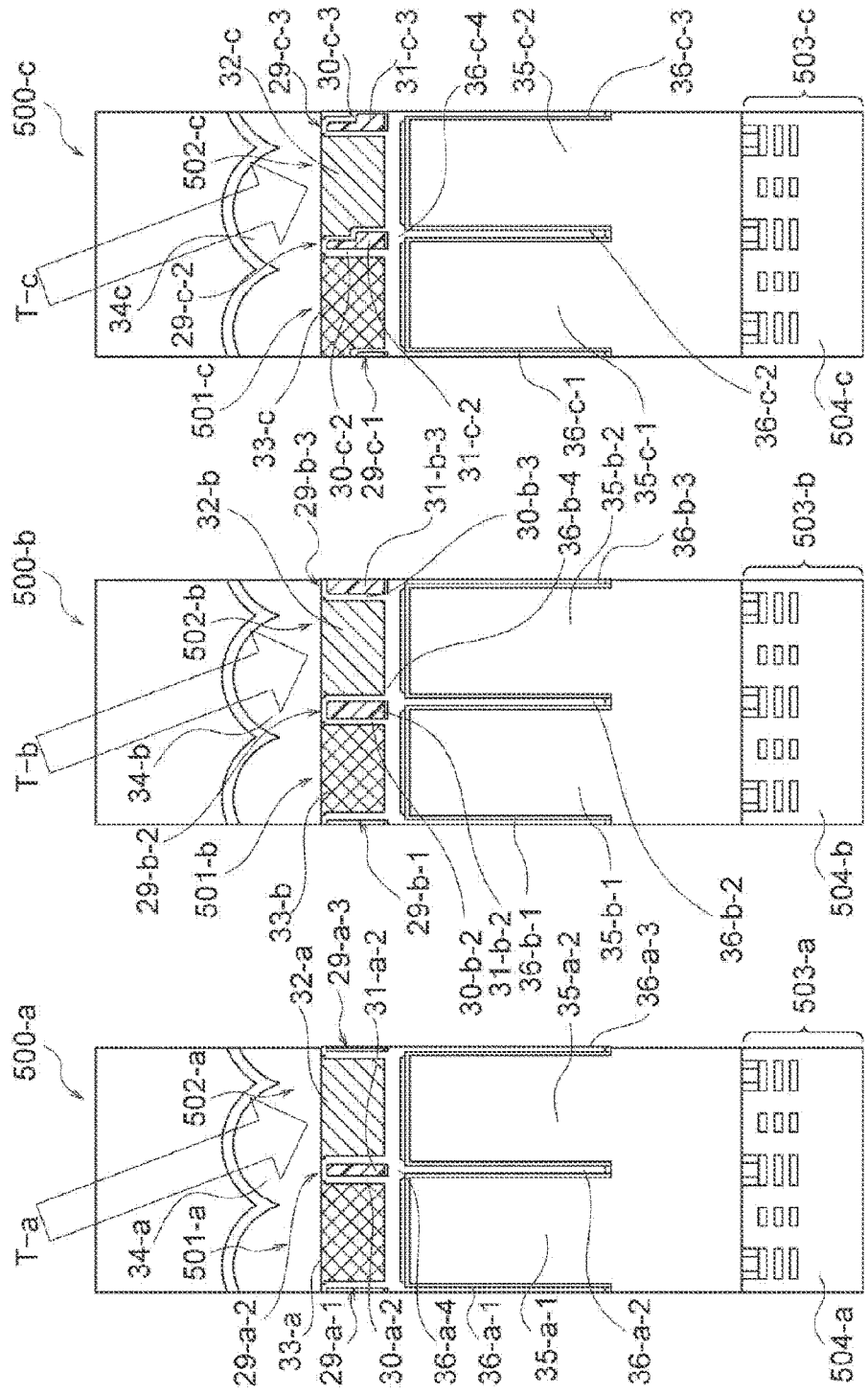

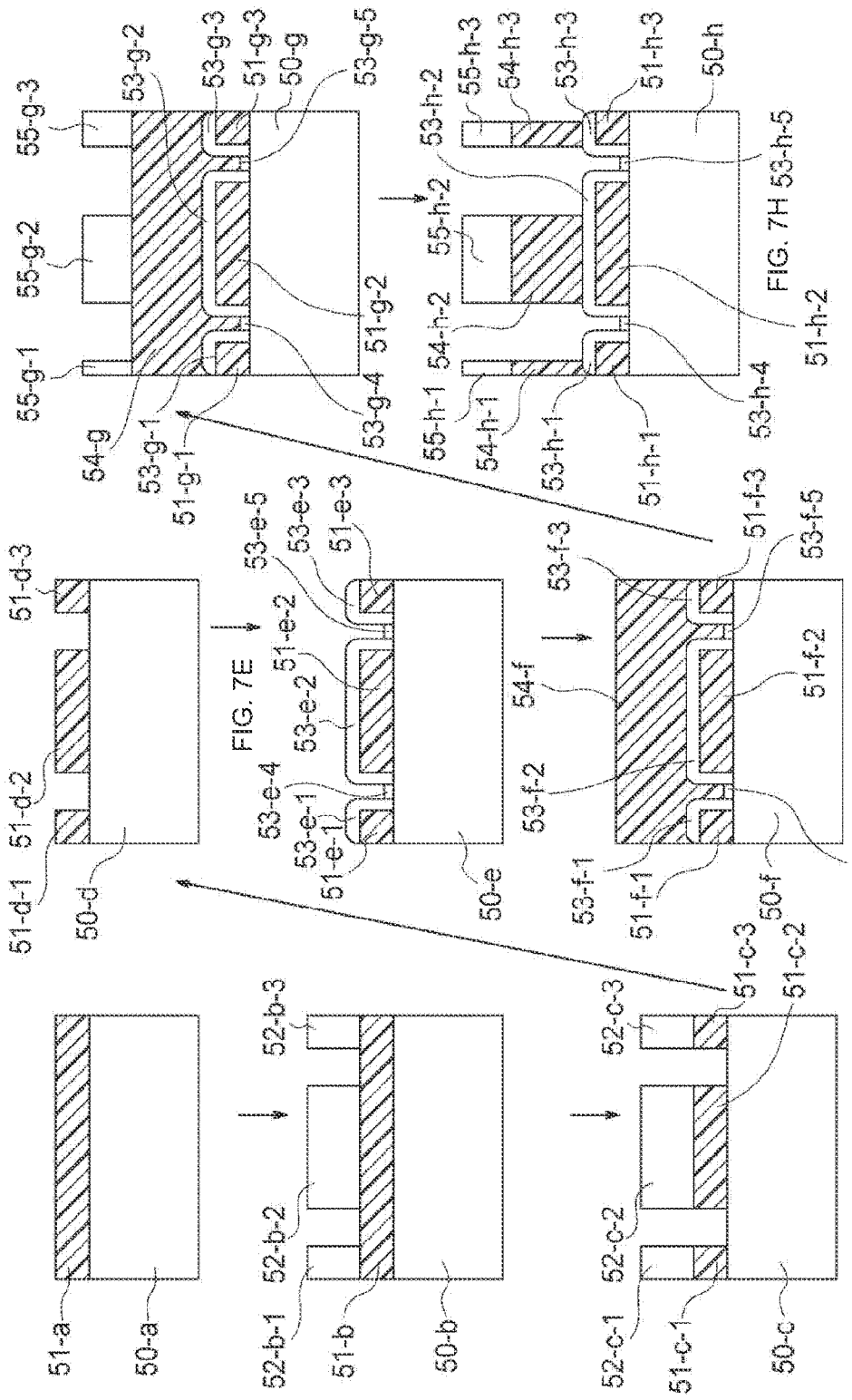

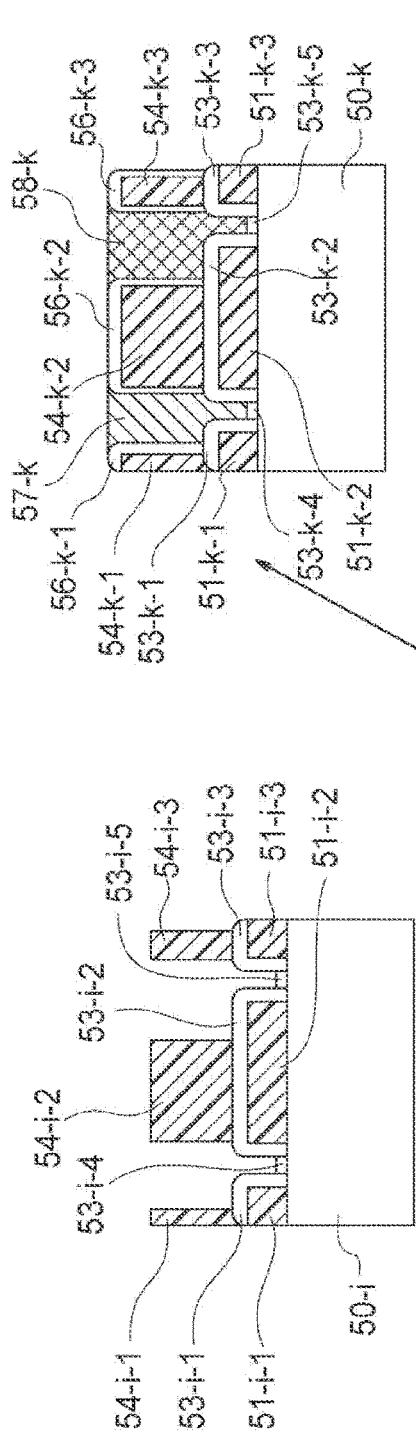
FIG. 8A
FIG. 8B
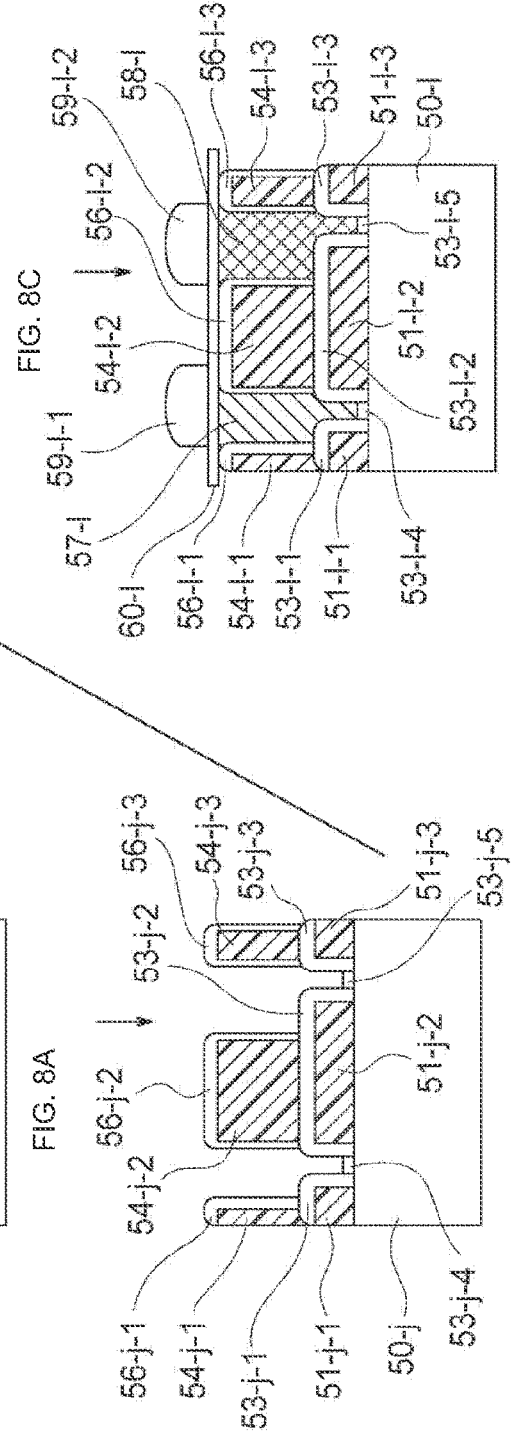
FIG. 8C
FIG. 8D

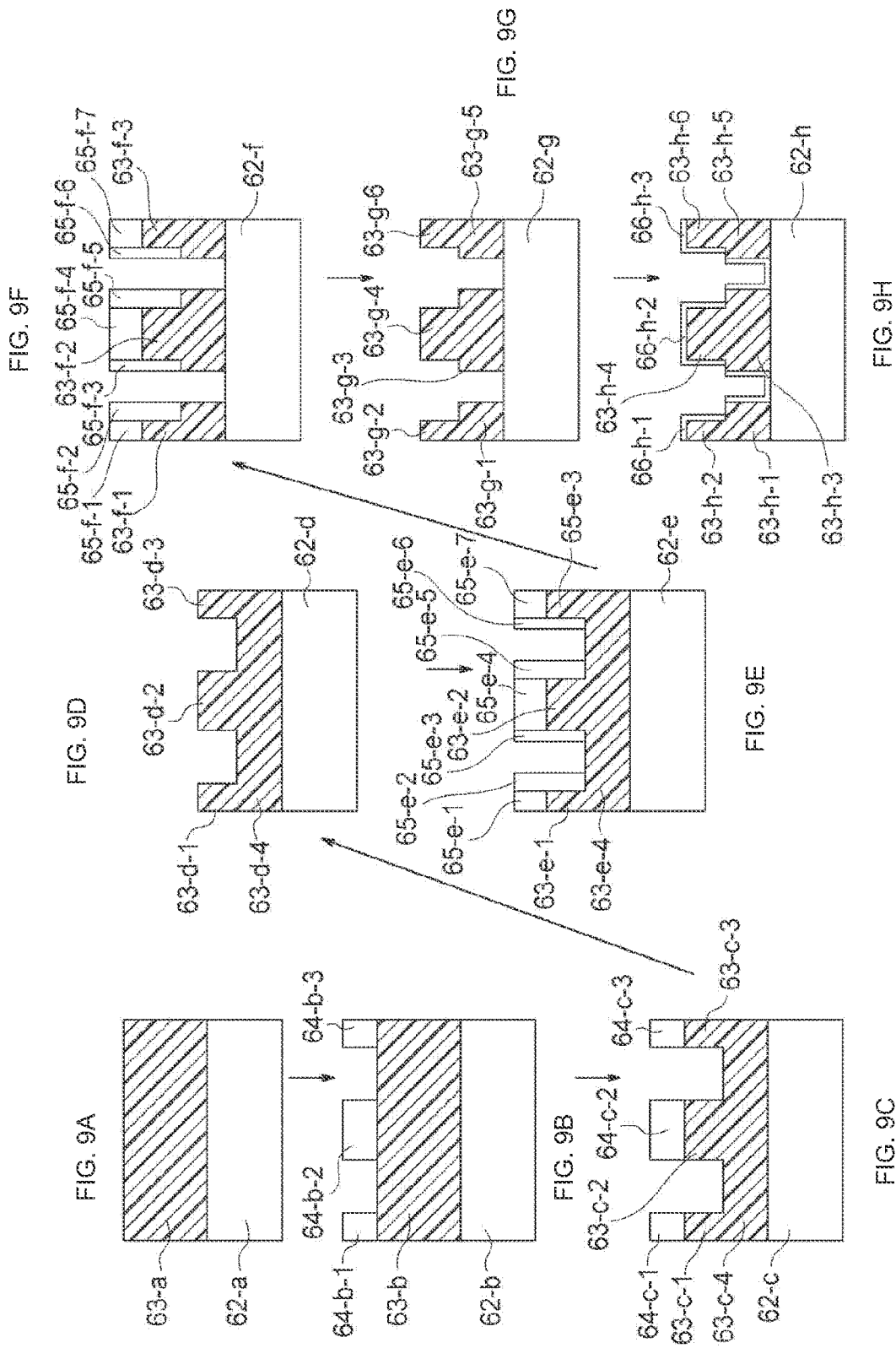

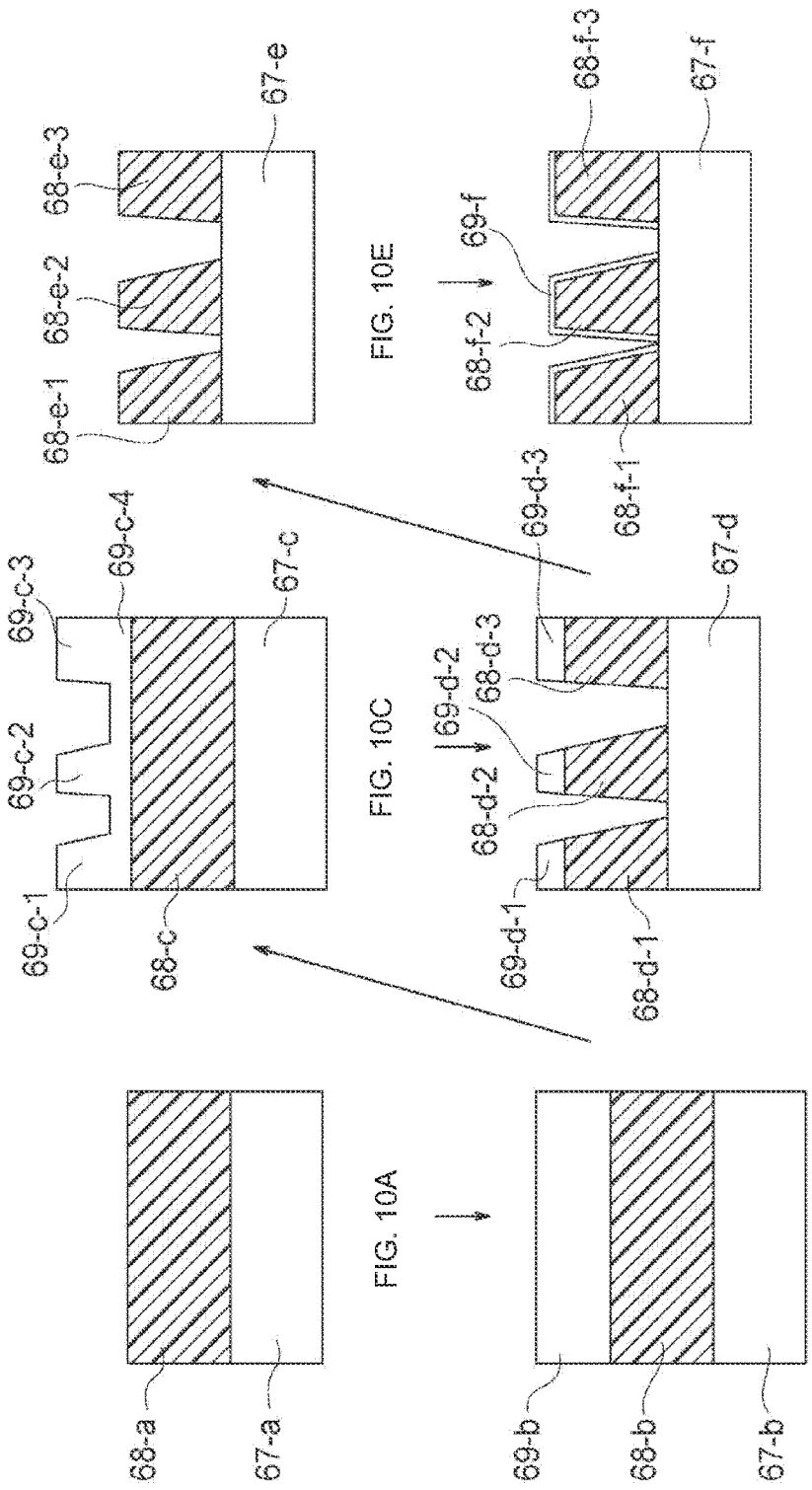

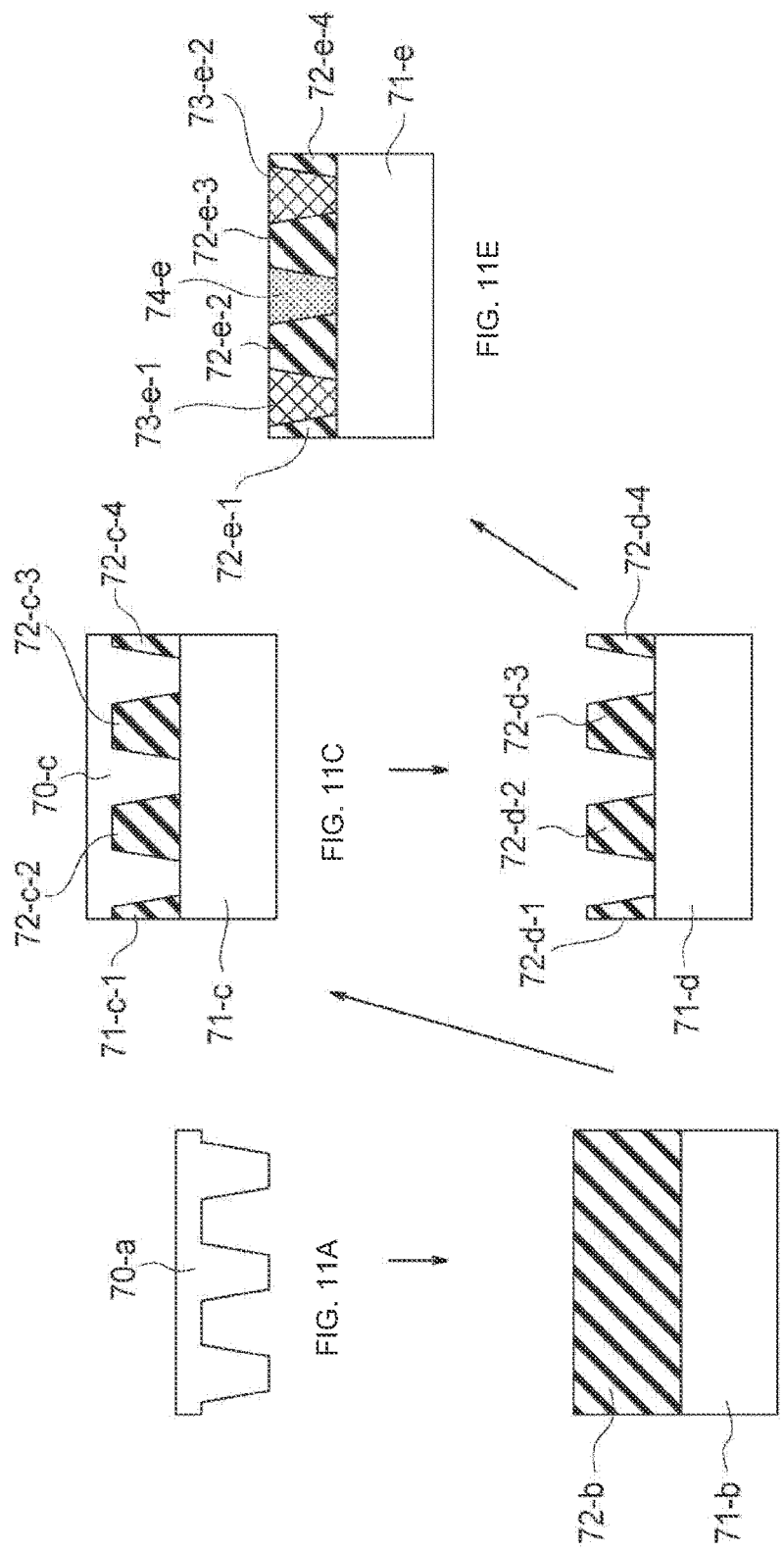

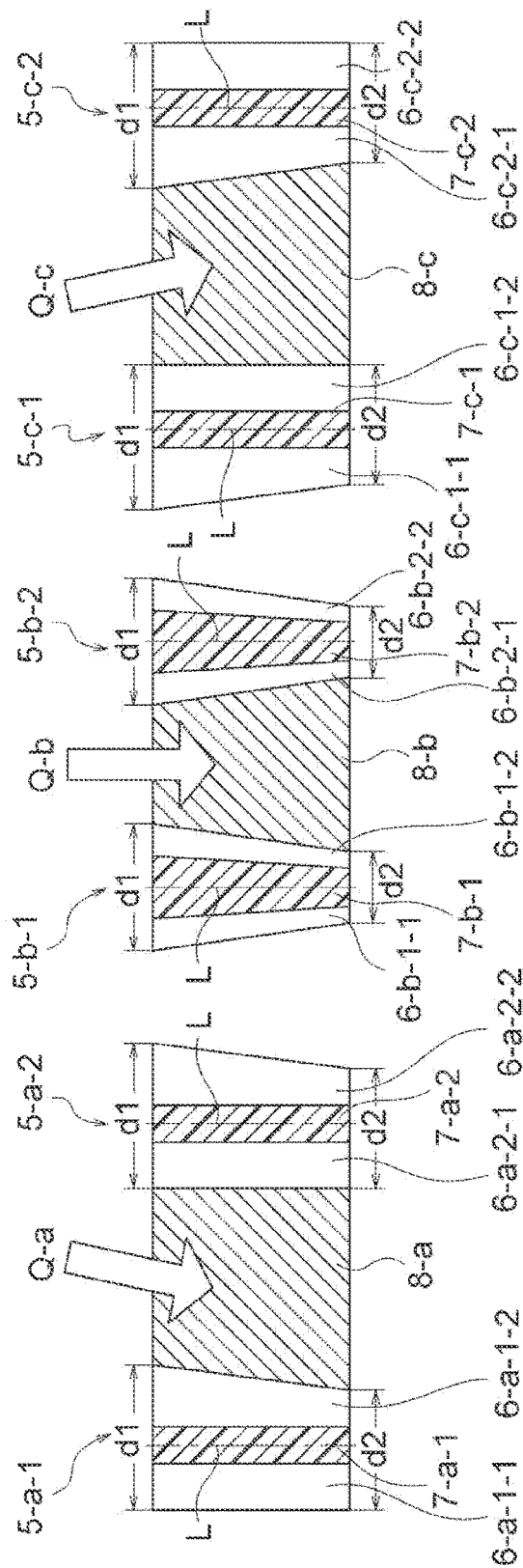

SOLID-STATE IMAGING DEVICE AND ELECTRONIC APPARATUS

CROSS REFERENCE TO RELATED APPLICATIONS

This application is a U.S. National Phase of International Patent Application No. PCT/JP2019/014799 filed on Apr. 3, 2019, which claims priority benefit of Japanese Patent Application No. JP 2018-124550 filed in the Japan Patent Office on Jun. 29, 2018. Each of the above-referenced applications is hereby incorporated herein by reference in its entirety.

TECHNICAL FIELD

The present technology relates to a solid-state imaging device and an electronic apparatus.

BACKGROUND ART

In general, solid-state imaging devices such as complementary metal oxide semiconductors (CMOS) image sensor and charge coupled devices (CCD) are widely used in digital still cameras, digital video cameras, and the like.

In recent years, various studies and developments have been carried out to improve the image quality of the solid-state imaging devices.

For example, a solid-state imaging device including a partition grid has been proposed (see Patent Document 1).

CITATION LIST

Patent Document

Patent Document 1: Japanese Patent Application Laid-Open No. 2016-063171

SUMMARY OF THE INVENTION

Problems to be Solved by the Invention

However, the technology proposed in Patent Document 1 may not be able to further improve the image quality.

Therefore, the present technology has been made in view of the foregoing and a principal object of the present technology is to provide a solid-state imaging device capable of further improving the image quality and an electronic apparatus equipped with the solid-state imaging device.

Solutions to Problems

As a result of earnest research to achieve the above-described object, the present inventors have succeeded in dramatically improving the image quality and have reached completed the present technology.

That is, the present technology first provides a solid-state imaging device including:
- a pixel array unit in which a plurality of pixels is one-dimensionally or two-dimensionally arrayed, in which the pixel array unit includes a color filter and a semiconductor substrate for each pixel,
- a partition layer is formed between the color filters,
- the partition layer has a first width and a second width in order from a light incident side, and
- the first width and the second width are different.

In the solid-state imaging element according to the present technology, the second width may be larger than the first width.

In the solid-state imaging element according to the present technology, the first width may be larger than the second width.

In the solid-state imaging element according to the present technology, the partition layer may include a plurality of layers in which a layer on the light incident side is an uppermost layer and a layer on an opposite site of the light incident side is a lowermost layer,
  the uppermost layer may have a width on the light incident side and a width on the opposite side of the light incident side, and the width on the light incident side of the uppermost layer may be the first width, and
  the lowermost layer may have a width on the light incident side and a width on the opposite side of the light incident side, and the width on the opposite side of the light incident side of the lowermost layer may be the second width.

In the solid-state imaging element according to the present technology, the partition layer may include two layers in which a layer on the light incident side is a first layer and a layer on an opposite side of the light incident side is a second layer,
  the first layer may have a width on the light incident side and a width on the opposite side of the light incident side, and the width on the light incident side of the first layer may be the first width and the width on the opposite side of the light incident side of the first layer may be a third width, and
  the second layer may have a width on the light incident side and a width on the opposite side of the light incident side, and the width on the light incident side of the second layer may be a fourth width and the width on the opposite side of the light incident side of the second layer may be the second width.

In the solid-state imaging element according to the present technology, the partition layer includes a plurality of stages in which a stage on the light incident side is an uppermost stage and a stage on an opposite site of the light incident side is a lowermost stage,
  the uppermost stage may have a width on the light incident side and a width on the opposite side of the light incident side, and the width on the light incident side of the uppermost stage may be the first width, and
  the lowermost stage may have a width on the light incident side and a width on the opposite side of the light incident side, and the width on the opposite side of the light incident side of the lowermost stage may be the second width.

In the solid-state imaging element according to the present technology, the partition layer may include two stages in which a stage on the light incident side is a first stage and a stage on an opposite side of the light incident side is a second stage,
  the first stage may have a width on the light incident side and a width on the opposite side of the light incident side, and the width on the light incident side of the first stage may be the first width and the width on the opposite side of the light incident side of the first stage may be a fifth width, and
  the second stage may have a width on the light incident side and a width on the opposite side of the light incident side, and the width on the light incident side of the second stage may be a sixth width and the width on the opposite side of the light incident side of the second stage may be the second width.

In the solid-state imaging element according to the present technology, a cross-sectional shape of the partition layer formed in a central portion of the pixel array unit may be substantially right-left symmetrical.

In the solid-state imaging element according to the present technology, a cross-sectional shape of the partition layer formed in a peripheral portion of the pixel array unit may be right-left asymmetrical.

In the solid-state imaging element according to the present technology, the partition layer may include an oxide film and a metal film, and the metal film may be covered with the oxide film.

Moreover, the present technology provides
an electronic apparatus equipped with a solid-state imaging device, the solid-state imaging device including:
a pixel array unit in which a plurality of pixels is one-dimensionally or two-dimensionally arrayed, in which the pixel array unit includes a color filter and a semiconductor substrate for each pixel,
a partition layer is formed between the color filters,
the partition layer has a first width and a second width in order from a light incident side, and
the first width and the second width are different.

Effect of the Invention

According to the present technology, the image quality can be further improved. Note that the effects described here are not necessarily limited, and any of the effects described in the present disclosure may be exhibited.

BRIEF DESCRIPTION OF DRAWINGS

FIGS. 1A, 1B, and 1C are cross-sectional views illustrating configuration examples of partition layers provided in a solid-state imaging device according to a first embodiment to which the present technology is applied.

FIGS. 3A and 3B are cross-sectional views illustrating configuration examples of peripheral pixels of the solid-state imaging device according to the first embodiment to which the present technology is applied.

FIGS. 4A, 4B, and 4C are cross-sectional views illustrating configuration examples of right-side peripheral pixels of the solid-state imaging device with pupil correction.

FIGS. 7A, 7B, 7C, 7D, 7E, 7F, 7G, and 7H are cross-sectional views illustrating an example of a method of manufacturing the partition layer provided in the solid-state imaging device according to the first embodiment to which the present technology is applied.

FIGS. 8A, 8B, 8C, and 8D are cross-sectional views illustrating an example of the method of manufacturing the partition layer provided in the solid-state imaging device according to the first embodiment to which the present technology is applied.

FIGS. 9A, 9B, 9C, 9D, 9E, 9F, 9G, and 9H are cross-sectional views illustrating an example of the method of manufacturing the partition layer provided in the solid-state imaging device according to the first embodiment to which the present technology is applied.

FIGS. 10A, 10B, 10C, 10D, 10E, and 10F are cross-sectional views illustrating an example of the method of manufacturing the partition layer provided in the solid-state imaging device according to the first embodiment to which the present technology is applied.

FIGS. 11A, 11B, 11C, 11D, and 11E are cross-sectional views illustrating an example of the method of manufacturing the partition layer provided in the solid-state imaging device according to the first embodiment to which the present technology is applied.

FIGS. 12A, 12B, and 12C are cross-sectional views illustrating configuration examples of partition layers provided in a solid-state imaging device according to a second embodiment to which the present technology is applied.

MODE FOR CARRYING OUT THE INVENTION

Figures 2A, 2B:
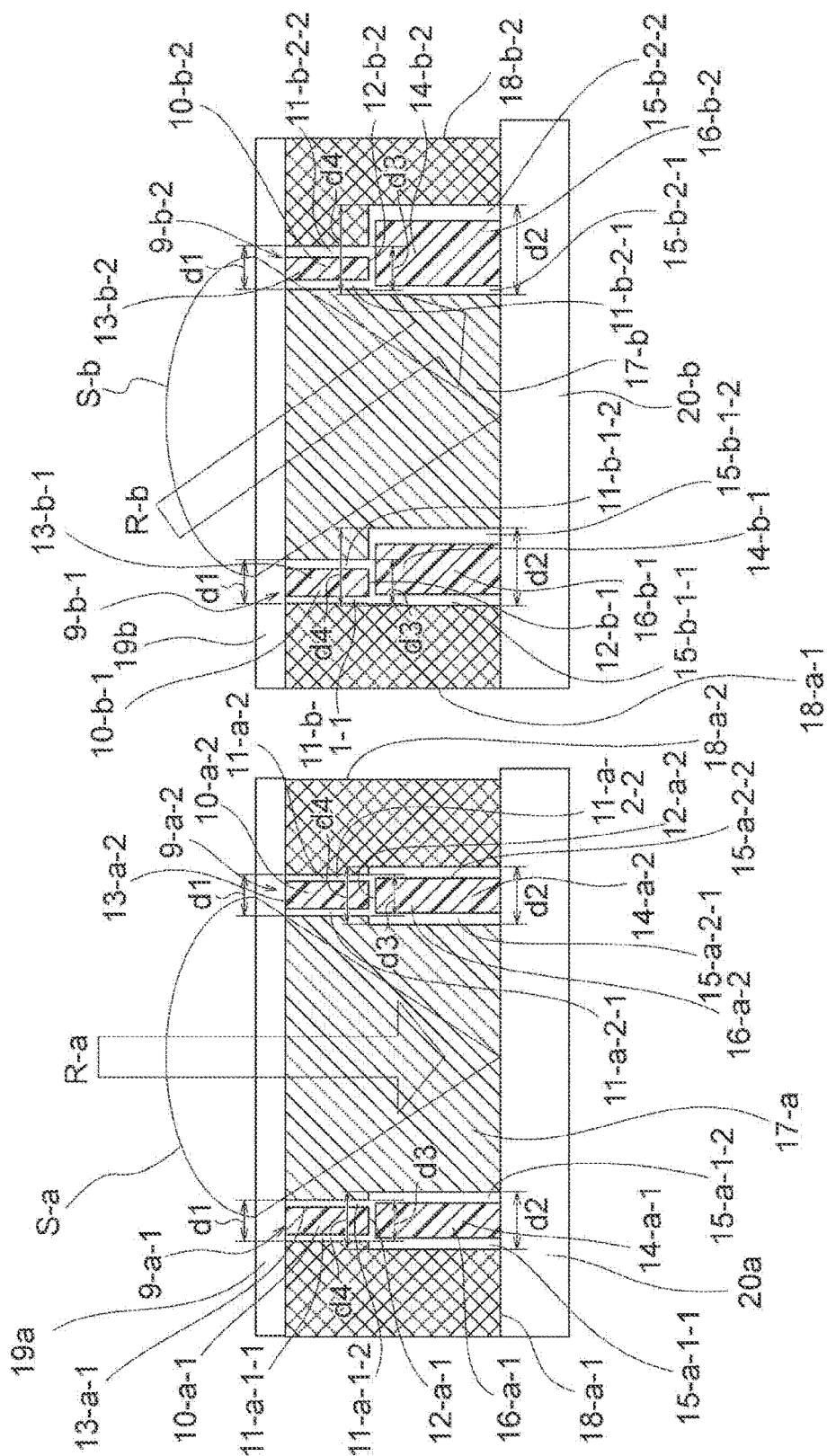
FIGS. 2A and 2B are cross-sectional views illustrating configuration examples of partition layers provided in the solid-state imaging device according to the first embodiment to which the present technology is applied.

Hereinafter, modes for carrying out the present technology will be described. The embodiments described below describe examples of a representative embodiment of the present technology, and the scope of the present technology is not construed in a narrow manner by the embodiments. Note that, in the description of the drawings, a term including "up" means an upward direction, upper side, or an upper portion in the drawings, a term including "lower" means a downward direction, a lower side, or a lower portion in the drawings, a terms including "left" means a left direction, a left side, or a left portion in the drawings, and a term including "right" means a right direction, a right side, or a right portion in the drawings, unless otherwise specified.

Note that the description will be given in the following order.
1. Outline of Present Technology
2. First Embodiment (Example 1 of Solid-State Imaging Device)
3. Second Embodiment (Example 2 of Solid-State Imaging Device)
4. Third Embodiment (Example of Electronic Apparatus)
5. Use Example of Solid-State Imaging Device To Which Present Technology is Applied 1. Outline of Present Technology As a method of optically separating a color filter (CF), the color filter can be separated by a material having a refractive index smaller than that of the color filter such as an oxide film. By forming the separating material (oxide film or the like) with the material having a refractive index smaller than that of the color filter and separating the color filter, light is totally reflected at an interface between a color filter material and the separating material. Therefore, improvement of sensitivity and reduction of color mixture are expected.

For example, the structure of a partition layer may be a structure having one layer of oxide film or may be a structure having a metal in a central portion and covering the metal with the oxide film or the like. The partition layer may be a single layer (one stage) or have a structure in which widths of CF partition members are the same. If the partition layer is a single layer and an upper width and a lower width are the same, it may be difficult to take measures against shading in a peripheral portion of an imaging region although it is not difficult in a central portion of the imaging region. An example of the measures includes a method (scaling, pupil correction, or the like) of shifting a microlens (on-chip lens), a CF partition layer, and an aperture defining layer toward the central portion of the imaging region. However, if the width of the CF partition layer is large, the light may be kicked by the CF partition layer, which may lead to a decrease in sensitivity.

The present technology has been made in view of the above circumstances. The partition layer (also referred to as color filter (CF) partition layer, which applies to below) according to the present technology is characterized in that a peripheral portion of an imaging region (pixel array unit) of a CMOS sensor is right-left asymmetrical. The CF partition layer may be configured by a metal layer and an oxide film with which the metal layer is covered. The shape of the CF partition layer may be a forward taper shape or a reverse taper shape. The CF partition layer may be formed in a single layer structure or a stacked structure of two or more layers (a plurality of layers) or may be formed in a single stage structure or a structure of two or more stages (a plurality of stages). When the CF partition layer has a two-layer structure, the width of a lower layer (also referred to as second layer on a semiconductor substrate side or which is closer to the semiconductor substrate) of the CF partition layer may be larger than the width of an upper layer (also referred to as first layer on a light incident surface side). Furthermore, it is favorable that the width of the CF partition layer differs within a chip surface, and at least one of end portions of the CF partition layer is located between pixels (including a pixel boundary) or within its own pixel region (including the pixel boundary), and the CF partition layer is formed not to completely protrude into an adjacent pixel.

Effects of the present technology are, for example, the following four points.

Light reflection at an interface between the color filter (CF) and the oxide film can be suppressed and light leakage to an adjacent pixel can be suppressed by light-shielding by a metal in the CF partition, a decrease in sensitivity can be suppressed, color mixture can be reduced, and shading can be suppressed.

For example, in a CF partition layer including an upper layer (first layer) on the light incident side and a lower layer (second layer) on the semiconductor substrate side or a CF partition layer including an upper stage (first stage) on the light incident side and a lower stage (second stage) on the semiconductor substrate side, the upper layer (first layer) or the upper stage (first stage) can be moved, and thus more appropriate pupil correction can be performed. That is, the upper layer (first layer) or the upper stage (first stage) expands a pupil-correctable range by the CF partition layer.

In the CF partition layer, when the lower layer (for example, the second layer) or the lower stage (for example, the second stage) is larger than the upper layer in width, the light leakage to the adjacent pixel due to oblique light incident can be suppressed or the stability of manufacturing can be secured (the partition layer does not collapse during manufacturing).

Since the width of the CF partition layer is different between the central portion and the peripheral portion of the imaging region (pixel array unit), color mixture due to oblique light can be more properly suppressed in the peripheral portion. That is, the width of the partition layer is different for each pixel in the chip surface.

Hereinafter, the present technology will be described in detail.

2. First Embodiment (Example 1 of Solid-State Imaging Device)

A solid-state imaging device according to a first embodiment (Example 1 of a solid-state imaging device) according to the present technology is a solid-state imaging device including a pixel array unit in which a plurality of pixels is one-dimensionally or two-dimensionally arrayed, the pixel array unit including a color filter and a semiconductor substrate for each pixel, a partition layer being formed between the color filters, the partition layer having a first width and a second width in order from a light incident side, the first width and the second width being different, and the second width being larger than the first width. The first width is a width on the light incident side and is substantially parallel to a surface of the semiconductor substrate. Furthermore, the first width may be substantially parallel to a surface of a flattening layer that may be arranged on the color filter. The second width is a width on the semiconductor substrate side and is substantially parallel to a surface of the semiconductor substrate.

According to the solid-state imaging device of the first embodiment of the present technology, the image quality is improved. In particular, according to the solid-state imaging device of the first embodiment of the present technology, shading can be suppressed, a decrease in sensitivity can be suppressed, and color mixture can be suppressed.

FIGS. 1A, 1B, and 1C illustrate cross-sectional views of partition layers provided in the solid-state imaging device according to the first embodiment of the present technology. FIG. 1A illustrates a partition layer 1-$a$-1 and a partition layer 1-$a$-2 formed between pixels (for example, left-end pixels) in a left peripheral portion of a pixel array unit (imaging region). FIG. 1B illustrates a partition layer 1-$b$-1 and a partition layer 1-$b$-2 formed between pixels (for example, central pixels) in a central portion of the pixel array unit (imaging region). FIG. 1C illustrates a partition layer 1-$c$-1 and a partition layer 1-$c$-2 formed between pixels (for example, right-end pixels) in a right peripheral portion of the pixel array unit (imaging region).

The partition layer 1-$a$-1 is arranged on the left side of a color filter 4-$a$ (for example, a color filter for green light) and is configured by a metal layer 3-$a$-1 covered with oxide films 2-$a$-1-1 and 2-$a$-1-2. The partition layer 1-$a$-1 has a second width d2 larger than a first width d1, has a forward taper shape, and is asymmetric with respect to a center line L. A refractive index of the oxide films 2-$a$-1-1 and 2-$a$-1-2 is favorably smaller than that of the color filter 4-$a$. According to this favorable mode, light can be totally reflected at an interface between the color filter 4-$a$ and the oxide film 2-$a$-1-2.

The partition layer 1-$a$-2 is arranged on the right side of the color filter 4-$a$ and is configured by a metal layer 3-$a$-2 covered with oxide films 2-$a$-2-1 and 2-$a$-2-2. The partition layer 1-$a$-2 has the second width d2 larger than the first width d1, has a forward taper shape, and is asymmetric with respect to the center line L. The refractive index of the oxide films 2-$a$-2-1 and 2-$a$-2-2 is favorably smaller than that of the color filter 4-$a$. According to this favorable mode, light can be totally reflected at an interface between the color filter 4-$a$ and the oxide film 2-$a$-2-1.

The partition layers 1-*a*-1 and 1-*a*-2 are shifted in a right direction that is a central portion direction of the imaging region (pixel array unit), and an aperture area (an area on a light-receiving side of the color filter 4-*a*) expands in the right direction, with respect to oblique light P-a.

The partition layer 1-*b*-1 is arranged on the left side of a color filter 4-*b* (for example, a color filter for green light) and is configured by a metal layer 3-*b*-1 covered with oxide films 2-*b*-1-1 and 2-*b*-1-2. The partition layer 1-*b*-1 has the second width d2 larger than the first width d1, has a forward taper shape, and is substantially symmetric with respect to the center line L. The refractive index of the oxide films 2-*b*-1-1 and 2-*b*-1-2 is favorably smaller than that of the color filter 4-*b*. According to this favorable mode, light can be totally reflected at an interface between the color filter 4-*b* and the oxide film 2-*b*-1-2.

The partition layer 1-*b*-2 is arranged on the right side of the color filter 4-*b* and is configured by a metal layer 3-*b*-2 covered with oxide films 2-*b*-2-1 and 2-*b*-2-2. The partition layer 1-*b*-2 has the second width d2 larger than the first width d1, has a forward taper shape, and is substantially symmetric with respect to the center line L. The refractive index of the oxide films 2-*b*-2-1 and 2-*b*-2-2 is favorably smaller than that of the color filter 4-*b*. According to this favorable mode, light can be totally reflected at an interface between the color filter 4-*b* and the oxide film 2-*b*-2-1.

The partition layers 1-*b*-1 and 1-*b*-2 do not shift in a right-left direction, and an aperture area (an area on the light-receiving side of the color filter 4-*b*) does not expand in the right-left direction, with respect to vertical light P-b.

The partition layer 1-*c*-1 is arranged on the left side of a color filter 4-*c* (for example, a color filter for green light) and is configured by a metal layer 3-*c*-1 covered with oxide films 2-*c*-1-1 and 2-*c*-1-2. The partition layer 1-*c*-1 has the second width d2 larger than the first width d1, has a forward taper shape, and is asymmetric with respect to the center line L. The refractive index of the oxide films 2-*c*-1-1 and 2-*c*-1-2 is favorably smaller than that of the color filter 4-*c*. According to this favorable mode, light can be totally reflected at an interface between the color filter 4-*c* and the oxide film 2-*c*-1-2.

The partition layer 1-*c*-2 is arranged on the right side of the color filter 4-*c* and is configured by a metal layer 3-*c*-2 covered with oxide films 2-*c*-2-1 and 2-*c*-2-2. The partition layer 1-*c*-2 has the second width d2 larger than the first width d1, has a forward taper shape, and is asymmetric with respect to the center line L. The refractive index of the oxide films 2-*c*-2-1 and 2-*c*-2-2 is favorably smaller than that of the color filter 4-*c*. According to this favorable mode, light can be totally reflected at an interface between the color filter 4-*c* and the oxide film 2-*c*-2-1.

The partition layers 1-*c*-1 and 1-*c*-2 are shifted in a left direction that is the central portion direction of the imaging region (pixel array unit), and an aperture area (an area on the light-receiving side of the color filter 4-*c*) expands in the left direction, with respect to oblique light P-c.

FIGS. 2A and 2B illustrate cross-sectional views of partition layers provided in the solid-state imaging device according to the first embodiment of the present technology. FIG. 2A illustrates a partition layer 9-*a*-1 and a partition layer 9-*a*-2 formed between pixels (for example, central pixels) in the central portion of the pixel array unit (imaging region). FIG. 2B illustrates a partition layer 9-*b*-1 and a partition layer 9-*b*-2 formed between pixels (for example, right-end pixels) in the right peripheral portion of the pixel array unit (imaging region).

See FIG. 2A. In FIG. 2A, a flattening layer 19*a*, color filters 17-*a* (a color filter for green light, for example), 18-*a*-1 (a color filter for red light, for example), and 18-*a*-2 (a color filter for red light, for example), and a semiconductor substrate 20-*a* are arranged in order from light incidence R-a (vertical light incidence). The partition layer 9-*a*-1 is arranged between the color filters 18-*a*-1 and 17-*a* (between pixels or at a boundary of pixels), and the partition layer 9-*a*-2 is arranged between the color filters 17-*a* and 18-*a*-2 (between pixels or at a boundary of pixels).

The partition layer 9-*a*-1 has a two-layer structure, and is configured by a first layer 10-*a*-1 on the light incidence R-a side and a second layer 14-*a*-1 on a semiconductor substrate 20-*a* side. The first width on the light incident side of the first layer 10-*a*-1 is d1 and a third width on the semiconductor substrate side of the first layer 10-*a*-1 is d3, and a fourth width on the light incidence R-a side of the second layer 14-*a*-1 is d4 and the second width on the semiconductor substrate side of the second layer 14-*a*-1 is d2. The first width and the third width of the first layer 10-*a*-1 and the second width and the fourth width of the second layer 14-*a*-1 are substantially parallel to the flattening layer 19-*a* and the semiconductor substrate 20-*a* side. Note that, in the case where the partition layer 9-*a*-1 has a two-stage structure, the first width and a fifth width (a width on an opposite side of the light incident side R-a, that is, on the semiconductor substrate 20-*a* side) of a first stage, and the second width and a sixth width (a width on the light incident side R-a) of a second stage are also substantially parallel to the flattening layer 19-*a* and the semiconductor substrate 20-*a*. d2 and d4 are larger than d1 and d3. The first layer 10-*a*-1 is configured by a metal layer 13-*a*-1 covered with oxide films 11-*a*-1-1 and 11-*a*-1-2 and 12-*a*-1. The second layer 14-*a*-1 is configured by a metal layer 16-*a*-1 covered with oxide films 12-*a*-1, and 15-*a*-1-1 and 15-*a*-1-2.

The partition layer 9-*a*-2 has a two-layer structure, and is configured by a first layer 10-*a*-2 on the light incidence R-a side and a second layer 14-*a*-2 on the semiconductor substrate 20-*a* side. The first width on the light incidence R-a side of the first layer 10-*a*-2 is d1 and the third width on the semiconductor substrate 20-*a* side of the first layer 10-*a*-2 is d3, and the fourth width on the light incident side of the second layer 14-*a*-2 is d4 and the second width on the semiconductor substrate side of the second layer 14-*a*-2 is d2. The first width and the third width of the first layer 10-*a*-2 and the second width and the fourth width of the second layer 14-*a*-2 are substantially parallel to the flattening layer 19-*a* and the semiconductor substrate 20-*a*. Note that, in the case where the partition layer 9-*a*-2 has a two-stage structure, the first width and the fifth width (the width on the opposite side of the light incident side R-a, that is, on the semiconductor substrate 20-*a* side) of the first stage, and the second width and the sixth width (the width on the light incident side R-a) of the second stage are also substantially parallel to the flattening layer 19-*a* and the semiconductor substrate 20-*a*. d2 and d4 are larger than d1 and d3. The first layer 10-*a*-2 is configured by a metal layer 13-*a*-2 covered with oxide films 11-*a*-2-1 and 11-*a*-2-2 and 12-*a*-2. The second layer 14-*a*-2 is configured by a metal layer 16-*a*-2 covered with oxide films 12-*a*-2, and 15-*a*-2-1 and 15-*a*-2-2.

In FIG. 2A, since the pixel is in the central portion of the pixel array unit (imaging region), light is focused at a pixel center without pupil correction (S-a).

See FIG. 2B. In FIG. 2B, a flattening layer 19*b*, color filters 17-*b* (a color filter for green light, for example), 18-*b*-1 (a color filter for red light, for example), and 18-*b*-2

(a color filter for red light, for example), and a semiconductor substrate 20-b are arranged in order from light incidence R-b (oblique light incidence). The partition layer 9-b-1 is arranged between the color filters 18-b-1 and 17-b, and the partition layer 9-b-2 is arranged between the color filters 17-b and 18-b-2.

The partition layer 9-b-1 has a two-layer structure, and is configured by a first layer 10-b-1 on the light incidence R-b side and a second layer 14-b-1 on the semiconductor substrate 20-b side. The first width on the light incident side of the first layer 10-b-1 is d1 and the third width on the semiconductor substrate side of the first layer 10-b-1 is d3, and the fourth width on the light incidence R-b side of the second layer 14-b-1 is d4 and the second width on the semiconductor substrate 20-b side of the second layer 14-b-1 is d2. The first width and the third width of the first layer 10-b-1 and the second width and the fourth width of the second layer 14-b-1 are substantially parallel to the flattening layer 19-b and the semiconductor substrate 20-b. Note that, in the case where the partition layer 9-b-1 has a two-stage structure, the first width and the fifth width (the width on the opposite side of the light incident side R-b, that is, on the semiconductor substrate 20-b side) of the first stage, and the second width and the sixth width (the width on the light incident side R-b) of the second stage are also substantially parallel to the flattening layer 19-b and the semiconductor substrate 20-b. d2 and d4 are larger than d1 and d3. The first layer 10-b-1 is configured by a metal layer 13-b-1 covered with oxide films 11-b-1-1 and 11-b-1-2 and 12-b-1. The second layer 14-b-1 is configured by a metal layer 16-b-1 covered with oxide films 12-b-1, and 15-b-1-1 and 15-b-1-2.

The partition layer 9-b-2 has a two-layer structure, and is configured by a first layer 10-b-2 on the light incidence R-b side and a second layer 14-b-2 on the semiconductor substrate 20-b side. The first width on the light incidence R-b side of the first layer 10-b-2 is d1 and the third width on the semiconductor substrate 20-b side of the first layer 10-b-2 is d3, and the fourth width on the light incidence R-b side of the second layer 14-a-2 is d4 and the second width on the semiconductor substrate 20-b side of the second layer 14-a-2 is d2. The first width and the third width of the first layer 10-b-2 and the second width and the fourth width of the second layer 14-b-2 are substantially parallel to the flattening layer 19-b and the semiconductor substrate 20-b. Note that, in the case where the partition layer 9-b-2 has a two-stage structure, the first width and the fifth width (the width on the opposite side of the light incident side R-b, that is, on the semiconductor substrate 20-b side) of the first stage, and the second width and the sixth width (the width on the light incidence R-b side) of the second stage are also substantially parallel to the flattening layer 19-b and the semiconductor substrate 20-b. d2 and d4 are larger than d1 and d3. The first layer 10-b-2 is configured by a metal layer 13-b-2 covered with oxide films 11-b-2-1 and 11-b-2-2 and 12-b-2. The second layer 14-b-2 is configured by a metal layer 16-b-2 covered with oxide films 12-b-2, and 15-b-2-1 and 15-b-2-2.

In FIG. 2B, since the pixel is in the right peripheral portion of the pixel array unit (imaging region), the first layers 10-b-1 and 10-b-2 of the partition layers 9-b-1 and 9-b-2 are shifted in the left direction (toward the central portion of the imaging region (pixel array unit)) in FIG. 2B by pupil correction, the aperture expands to the left (toward the central portion of the imaging region (pixel array unit)) in FIG. 2B, and the aperture area becomes large, and light is focused at the pixel center (S-b).

The partition layer formed in the peripheral portion of the imaging region has a factor of a decrease in sensitivity due to oblique light. As measures against lowering the sensitivity, a metal layer and a microlens that normally define an aperture are shifted toward the central portion of the imaging region. In the central portion of the imaging region, the metal film and the microlens that define the aperture are located at a pixel center position and do not need to be shifted. By shifting an aperture center toward the central portion of the imaging region in peripheral pixels, a focal point is set to the pixel center in the oblique light incidence, and the decrease in sensitivity is suppressed. The entire CF partition layer can be shifted toward the central portion of the imaging region by shifting the aperture center. However, in the present technology, for example, an upper layer shape of the CF partition layer is made asymmetric such that the aperture position center approaches the central portion of the imaging region, the aperture position center defining the aperture in the upper partition layer in the partition layers or the like stacked in two or more layers and on which light is incident, as illustrated in FIGS. 2A and 2B.

The partition layer is favorably a multi-layer structure of a plurality of layers (for example, two layers) or a multi-stage structure of a plurality of stages (for example, two stages). Then, a first width on a light incident side of an upper layer (for example, a first layer or a first stage) and a second width on a semiconductor substrate side of a lower layer (for example, a second layer or a second stage) are different. With the structure, oblique light (principal ray) from the central portion of the imaging region can be prevented from being kicked by the partition layer in the peripheral portion of the imaging region (the peripheral portion of the pixel array unit). If the width of the upper layer of the partition layer is smaller than the width of the lower layer, a range of shifting the upper layer expands, and the kicking of the light by the partition layer can be suppressed, which is favorable.

FIGS. 3A and 3B illustrate cross-sectional views of configuration examples of peripheral pixels of the solid-state imaging device according to the first embodiment of the present technology. The peripheral pixels illustrated in FIGS. 3A and 3B are pupil-corrected. FIG. 3A is a cross-sectional view of right-end two pixels (pixels 401-a and 402-a) of a solid-state imaging element 400-a. FIG. 3B is a cross-sectional view of left-end two pixels (pixels 401-b and 402-b) of a solid-state imaging element 400-b.

First, the solid-state imaging device 400-a will be described. In the pixel 401-a of the solid-state imaging element 400-a, an on-chip lens (microlens) 26-a, a color filter 25-a that transmits red light, an insulating layer 28-a-4 (for example, a silicon oxide film), and a semiconductor substrate 27-a-1 are arranged in order from the light incident side (from an upper side in FIG. 3A). A photodiode for red light (not illustrated) is formed in the semiconductor substrate 27-a-1 and is embedded in a silicon (Si) layer of the semiconductor substrate 27-a-1. Furthermore, in the pixel 402-a, the on-chip lens (microlens) 26-a, a color filter 24-a that transmits green light, the insulating layer 28-a-4 (for example, a silicon oxide film), and a semiconductor substrate 27-a-2 are arranged in order from the light incident side (from the upper side in FIG. 3A). A photodiode for green light (not illustrated) is formed in the semiconductor substrate 27-a-2 and is embedded in a silicon (Si) layer of the semiconductor substrate 27-a-2.

On a back surface (an upper surface in FIG. 3A) side of the semiconductor substrates 27-a-1 and 27-a-2, insulating films 28-a-1 to 28-a-4 are formed and embedded inside the semiconductor substrates 27-*a*-1 and 27-*a*-2. The insulating films 28-*a*-1 to 28-*a*-4 are, for example, silicon oxide films. The insulating film 28-*a*-2 is formed to partition the two pixels (pixels 401-*a* and 402-*a*). The insulating film 28-*a*-1 is formed to partition the pixel 401-*a* and a pixel on the left side of the pixel 401-*a* (not illustrated). The insulating film 28-*a*-3 is formed to partition the pixel 402-*a* and a pixel on the right side of the pixel 402-*a* (not illustrated).

On a front surface (a lower surface in FIG. 3A) side of the semiconductor substrates 27-*a*-1 and 27-*a*-2, a wiring layer 403-*a* is formed, and the wiring layer 403-*a* includes an interlayer film (for example, SiO2) 404-*a* and metal wiring.

The solid-state imaging element 400-*a* includes partition layers 21-*a*-1 to 21-*a*-3. The partition layer 21-*a*-2 is formed on the insulating layer 28-*a*-4 and between the pixel 401-*a* and the pixel 402-*a*. Furthermore, the partition layer 21-*a*-2 may be formed at a pixel boundary between the pixel 401-*a* and the pixel 402-*a*. The partition layer 21-*a*-1 is formed on the insulating layer 28-*a*-4 and between the pixel 401-*a* and the left pixel (not illustrated) of the pixel 401-*a*. Furthermore, the partition layer 21-*a*-1 may be formed at a pixel boundary between the pixel 401-*a* and the left pixel (not illustrated) of the pixel 401-*a*. The partition layer 21-*a*-3 is formed on the insulating layer 28-*a*-4 and between the pixel 402-*a* and the right pixel (not illustrated) of the pixel 402-*a*. Furthermore, the partition layer 21-*a*-3 may be formed at a pixel boundary between the pixel 402-*a* and the right pixel (not illustrated) of the pixel 402-*a*. The partition layer 21-*a*-2 is configured by a metal layer 23-*a*-2 covered with an oxide film (for example, an insulating film) 22-*a*-2. Furthermore, the partition layer 21-*a*-2 has a two-stage structure, and the width of the first stage (on light incident side) is smaller than the width of the second stage (on the semiconductor substrate side). Note that the partition layer 21-*a*-2 may be configured in a plurality of stages. The partition layer 21-*a*-3 is configured by a metal layer 23-*a*-3 covered with an oxide film (for example, an insulating film) 22-*a*-3. Furthermore, the partition layer 21-*a*-3 has a two-stage structure, and the width of the first stage (on light incident side) is smaller than the width of the second stage (on the semiconductor substrate side). Note that the partition layer 21-*a*-3 may be configured in a plurality of stages. The partition layer 21-*a*-1 is configured by a metal layer (not illustrated) covered with an oxide film (for example, an insulating film) (not illustrated). Furthermore, the partition layer 21-*a*-1 has a two-stage structure, and the width of the first stage (on light incident side) is smaller than the width of the second stage (on the semiconductor substrate side). Note that the partition layer 21-*a*-1 may be configured in a plurality of stages.

The solid-state imaging device 400-*b* will be described. In the pixel 401-*b* of the solid-state imaging element 400-*b*, an on-chip lens (microlens) 26-*b*, a color filter 24-*b* that transmits green light, an insulating layer 28-*b*-4 (for example, a silicon oxide film), and a semiconductor substrate 27-*b*-1 are arranged in order from the light incident side (from the upper side in FIG. 3B). A photodiode for green light (not illustrated) is formed in the semiconductor substrate 27-*b*-1 and is embedded in a silicon (Si) layer of the semiconductor substrate 27-*b*-1. Furthermore, in the pixel 402-*b*, the on-chip lens (microlens) 26-*b*, a color filter 25-*b* that transmits red light, the insulating layer 28-*b*-4 (for example, a silicon oxide film), and a semiconductor substrate 27-*b*-2 are arranged in order from the light incident side (from the upper side in FIG. 3B). A photodiode for red light (not illustrated) is formed in the semiconductor substrate 27-*b*-2 and is embedded in a silicon (Si) layer of the semiconductor substrate 27-*b*-2.

On a back surface (an upper surface in FIG. 3B) side of the semiconductor substrates 27-*b*-1 and 27-*b*-2, insulating films 28-*b*-1 to 28-*b*-4 are formed and embedded inside the semiconductor substrates 27-*b*-1 and 27-*b*-2. The insulating films 28-*b*-1 to 28-*b*-4 are, for example, silicon oxide films. The insulating film 28-*b*-2 is formed to partition the two pixels (pixels 401-*b* and 402-*b*). The insulating film 28-*b*-1 is formed to partition the pixel 401-*b* and a pixel on the left side of the pixel 401-*b* (not illustrated). The insulating film 28-*b*-3 is formed to partition the pixel 402-*b* and a pixel on the right side of the pixel 402-*b* (not illustrated).

On a front surface (a lower surface in FIG. 3A) side of the semiconductor substrates 27-*b*-1 and 27-*b*-2, a wiring layer 403-*b* is formed, and the wiring layer 403-*b* includes an interlayer film (for example, SiO2) 404-*b* and metal wiring.

The solid-state imaging element 400-*b* includes partition layers 21-*b*-1 to 21-*b*-3. The partition layer 21-*b*-2 is formed on the insulating layer 28-*b*-4 and between the pixel 401-*b* and the pixel 402-*b*. Furthermore, the partition layer 21-*b*-2 may be formed at a pixel boundary between the pixel 401-*b* and the pixel 402-*b*. The partition layer 21-*b*-1 is formed on the insulating layer 28-*b*-4 and between the pixel 401-*b* and the left pixel (not illustrated) of the pixel 401-*b*. Furthermore, the partition layer 21-*b*-1 may be formed at a pixel boundary between the pixel 401-*b* and the left pixel (not illustrated) of the pixel 401-*b*. The partition layer 21-*b*-3 is formed on the insulating layer 28-*b*-4 and between the pixel 402-*b* and the right pixel (not illustrated) of the pixel 402-*b*. Furthermore, the partition layer 21-*b*-3 may be formed at a pixel boundary between the pixel 402-*b* and a right pixel (not illustrated) of the pixel 402-*b*. The partition layer 21-*b*-2 is configured by a metal layer 23-*b*-2 covered with an oxide film (for example, an insulating film) 22-*b*-2. Furthermore, the partition layer 21-*b*-2 has a two-stage structure, and the width of the first stage (on light incident side) is smaller than the width of the second stage (on the semiconductor substrate side). Note that the partition layer 21-*b*-2 may be configured in a plurality of stages. The partition layer 21-*b*-1 is configured by a metal layer 23-*b*-1 covered with an oxide film (for example, an insulating film) 22-*b*-1. Furthermore, the partition layer 21-*b*-1 has a two-stage structure, and the width of the first stage (on light incident side) is smaller than the width of the second stage (on the semiconductor substrate side). Note that the partition layer 21-*b*-1 may be configured in a plurality of stages. The partition layer 21-*b*-3 is configured by a metal layer (not illustrated) covered with an oxide film (for example, an insulating film) (not illustrated). Furthermore, the partition layer 21-*b*-3 has a two-stage structure, and the width of the first stage (on light incident side) is smaller than the width of the second stage (on the semiconductor substrate side). Note that the partition layer 21-*a*-1 may be configured in a plurality of stages.

As described above, the partition layers at the right-end pixel position are formed into the shapes illustrated in FIG. 3A. Furthermore, the partition layers of the left-end pixels are formed into the shapes illustrated in FIG. 3B. With such a partition layer structure, the aperture position can be substantially shifted toward the center position of the imaging region, and the aperture expands by the amount of the narrowed width of the partition layer of the upper layer (here, the first stage on the light incident side, same as in the description in FIGS. 3A and 3B), which leads to improvement of sensitivity.

Furthermore, the partition layer of the upper layer is placed on the partition layer of the lower layer (here, the second stage on the semiconductor substrate side, same as in the description in FIGS. 3A and 3B), and in the case of the structure in which the width of the partition layer of the upper layer is smaller than the width of the partition layer of the lower layer, the range in which the partition layer of the upper layer is freely shifted on the partition layer of the lower layer can be made larger than a structure of a partition layer in which the width is the same from an upper end to a lower end of the partition layer. Therefore, the degree of freedom in shifting the CF partition layer of the upper layer is increased.

FIGS. 4A, 4B, and 4C are cross-sectional views illustrating configuration examples of peripheral pixels on the right side of the solid-state imaging device. The right-side peripheral pixels illustrated in FIGS. 4A, 4B, and 4C are pupil-corrected. FIG. 4A is a cross-sectional view of right-end two pixels (pixels 501-a and 502-a) of a solid-state imaging element 500-a. FIG. 4B is a cross-sectional view of left-end two pixels (pixels 501-b and 502-b) of a solid-state imaging element 500-b. FIG. 4C is a cross-sectional view of left-end two pixels (pixels 501-c and 502-c) of a solid-state imaging element 500-c.

First, the solid-state imaging device 500-a will be described. In the pixel 501-a of the solid-state imaging element 500-a, an on-chip lens (microlens) 34-a, a color filter 33-a that transmits red light, an insulating layer 36-a-4 (for example, a silicon oxide film), and a semiconductor substrate 35-a-1 are arranged in order from the light incident side (from oblique light T-a side). A photodiode for red light (not illustrated) is formed in the semiconductor substrate 35-a-1 and is embedded in a silicon (Si) layer of the semiconductor substrate 35-a-1. Furthermore, in the pixel 502-a, the on-chip lens (microlens) 34-a, a color filter 32-a that transmits green light, the insulating layer 36-a-4 (for example, a silicon oxide film), and a semiconductor substrate 35-a-2 are arranged in order from the light incident side. A photodiode for green light (not illustrated) is formed in the semiconductor substrate 35-a-2 and is embedded in a silicon (Si) layer of the semiconductor substrate 35-a-2.

On a back surface (an upper surface in FIG. 4A) side of the semiconductor substrates 35-a-1 and 35-a-2, insulating films 36-a-1 to 36-a-4 are formed and embedded inside the semiconductor substrates 35-a-1 and 35-a-2. The insulating films 36-a-1 to 36-a-4 are, for example, silicon oxide films. The insulating film 36-a-2 is formed to partition the two pixels (pixels 501-a and 502-a). The insulating film 36-a-1 is formed to partition the pixel 501-a and a pixel on the left side of the pixel 501-a (not illustrated). The insulating film 36-a-3 is formed to partition the pixel 502-a and a pixel on the right side of the pixel 502-a (not illustrated).

On a front surface (a lower surface in FIG. 4A) side of the semiconductor substrates 35-a-1 and 35-a-2, a wiring layer 503-a is formed, and the wiring layer 503-a includes an interlayer film (for example, SiO2) 504-a and metal wiring.

The solid-state imaging element 500-a includes partition layers 29-a-1 to 29-a-3. The partition layer 29-a-2 is formed on the insulating layer 36-a-4 and between the pixel 501-a and the pixel 502-a. Furthermore, the partition layer 29-a-2 may be formed at a pixel boundary between the pixel 501-a and the pixel 502-a. The partition layer 29-a-1 is formed on the insulating layer 36-a-4 and between the pixel 501-a and the left pixel (not illustrated) of the pixel 501-a. Furthermore, the partition layer 29-a-1 may be formed at a pixel boundary between the pixel 501-a and a left pixel (not illustrated) of the pixel 501-a. The partition layer 29-a-3 is formed on the insulating layer 36-a-4 and between the pixel 502-a and the right pixel (not illustrated) of the pixel 502-a. Furthermore, the partition layer 29-a-3 may be formed at a pixel boundary between the pixel 502-a and a right pixel (not illustrated) of the pixel 502-a. The partition layer 29-a-2 is configured by a metal layer 31-a-2 covered with an oxide film (for example, an insulating film) 30-a-2. Furthermore, the partition layer 29-a-2 has a one-stage structure, which is a structure having the same width from an upper end portion to a lower end portion. The width of the partition layer 29-a-2 is small and is, for example, 0.08 μm. The partition layer 29-a-3 is configured by a metal layer (not illustrated) covered with an oxide film (for example, an insulating film) (not illustrated). Furthermore, the partition layer 29-a-3 has a one-stage structure, which is a structure having the same width from an upper end portion to a lower end portion. The width of the partition layer 29-a-3 is small and is, for example, 0.08 μm.

The partition layer 29-a-1 is configured by a metal layer (not illustrated) covered with an oxide film (for example, an insulating film) (not illustrated). Furthermore, the partition layer 29-a-1 has a one-stage structure, which is a structure having the same width from an upper end portion to a lower end portion. The width of the partition layer 29-a-1 is small and is, for example, 0.08 μm.

The solid-state imaging device 500-b will be described. In the pixel 501-b of the solid-state imaging element 500-b, an on-chip lens (microlens) 34-b, a color filter 33-b that transmits red light, an insulating layer 36-b-4 (for example, a silicon oxide film), and a semiconductor substrate 35-b-1 are arranged in order from the light incident side (from oblique light T-b side). A photodiode for red light (not illustrated) is formed in the semiconductor substrate 35-b-1 and is embedded in a silicon (Si) layer of the semiconductor substrate 35-b-1. Furthermore, in the pixel 502-b, the on-chip lens (microlens) 34-b, a color filter 32-b that transmits green light, the insulating layer 36-b-4 (for example, a silicon oxide film), and a semiconductor substrate 35-b-2 are arranged in order from the light incident side. A photodiode for green light (not illustrated) is formed in the semiconductor substrate 35-b-2 and is embedded in a silicon (Si) layer of the semiconductor substrate 35-b-2.

On a back surface (an upper surface in FIG. 4B) side of the semiconductor substrates 35-b-1 and 35-b-2, insulating films 36-b-1 to 36-b-4 are formed and embedded inside the semiconductor substrates 35-b-1 and 35-b-2. The insulating films 36-b-1 to 36-b-4 are, for example, silicon oxide films. The insulating film 36-b-2 is formed to partition the two pixels (pixels 501-b and 502-b). The insulating film 36-b-1 is formed to partition the pixel 501-b and a pixel on the left side of the pixel 501-b (not illustrated). The insulating film 36-b-3 is formed to partition the pixel 502-b and a pixel on the right side of the pixel 502-b (not illustrated).

On a front surface (a lower surface in FIG. 4B) side of the semiconductor substrates 35-b-1 and 35-b-2, a wiring layer 503-b is formed, and the wiring layer 503-b includes an interlayer film (for example, SiO2) 504-b and metal wiring.

The solid-state imaging element 500-b includes partition layers 29-b-1 to 29-b-3. The partition layer 29-b-2 is formed on the insulating layer 36-b-4 and between the pixel 501-b and the pixel 502-b. Furthermore, the partition layer 21-b-2 may be formed at a pixel boundary between the pixel 501-b and the pixel 502-b. The partition layer 29-b-1 is formed on the insulating layer 36-b-4 and between the pixel 501-b and the left pixel (not illustrated) of the pixel 501-b. Furthermore, the partition layer 29-b-1 may be formed at a pixel boundary between the pixel 501-b and a left pixel (not illustrated) of the pixel 501-b. The partition layer 29-b-3 is formed on the insulating layer 36-b-4 and between the pixel 502-b and the right pixel (not illustrated) of the pixel 502-b. Furthermore, the partition layer 29-b-3 may be formed at a pixel boundary between the pixel 502-*b* and a right pixel (not illustrated) of the pixel 502-*b*. The partition layer 29-*b*-2 is configured by a metal layer 31-*b*-2 covered with an oxide film (for example, an insulating film) 30-*b*-2. Furthermore, the partition layer 29-*b*-2 has a one-stage structure, which is a structure having the same width from an upper end portion to a lower end portion. The width of the partition layer 29-*b*-2 is large and is, for example, 0.16 μm. The partition layer 29-*b*-3 is configured by a metal layer 31-*b*-2 covered with an oxide film (for example, an insulating film) 30-*b*-2. Furthermore, the partition layer 29-*b*-3 has a one-stage structure, which is a structure having the same width from an upper end portion to a lower end portion. The width of the partition layer 29-*b*-3 is small and is, for example, 0.08 μm. The partition layer 29-*b*-1 is configured by a metal layer (not illustrated) covered with an oxide film (for example, an insulating film) (not illustrated). Furthermore, the partition layer 29-*b*-1 has a one-stage structure, which is a structure having the same width from an upper end portion to a lower end portion. The width of the partition layer 29-*b*-1 is large and is, for example, 0.16 μm.

The solid-state imaging device 500-*c* will be described. In the pixel 501-*c* of the solid-state imaging element 500-*c*, an on-chip lens (microlens) 34-*c*, a color filter 33-*c* that transmits red light, an insulating layer 36-*c*-4 (for example, a silicon oxide film), and a semiconductor substrate 35-*c*-1 are arranged in order from the light incident side (from oblique light T-c side). A photodiode for red light (not illustrated) is formed in the semiconductor substrate 35-*c*-1 and is embedded in a silicon (Si) layer of the semiconductor substrate 35-*c*-1. Furthermore, in the pixel 502-*c*, the on-chip lens (microlens) 34-*c*, a color filter 32-*c* that transmits green light, the insulating layer 36-*c*-4 (for example, a silicon oxide film), and a semiconductor substrate 35-*c*-2 are arranged in order from the light incident side. A photodiode for green light (not illustrated) is formed in the semiconductor substrate 35-*c*-2 and is embedded in a silicon (Si) layer of the semiconductor substrate 35-*c*-2.

On a back surface (an upper surface in FIG. 4C) side of the semiconductor substrates 35-*c*-1 and 35-*c*-2, insulating films 36-*c*-1 to 36-*c*-4 are formed and embedded inside the semiconductor substrates 35-*c*-1 and 35-*c*-2. The insulating films 36-*c*-1 to 36-*c*-4 are, for example, silicon oxide films. The insulating film 36-*c*-2 is formed to partition the two pixels (pixels 501-*c* and 502-*c*). The insulating film 36-*c*-1 is formed to partition the pixel 501-*c* and a pixel on the left side of the pixel 501-*c* (not illustrated). The insulating film 36-*c*-3 is formed to partition the pixel 502-*c* and a pixel on the right side of the pixel 502-*c* (not illustrated).

On a front surface (a lower surface in FIG. 4C) side of the semiconductor substrates 35-*c*-1 and 35-*c*-2, a wiring layer 503-*c* is formed, and the wiring layer 503-*c* includes an interlayer film (for example, SiO2) 504-*c* and metal wiring.

The solid-state imaging element 500-*c* includes partition layers 29-*c*-1 to 29-*c*-3. The partition layer 29-*c*-2 is formed on the insulating layer 36-*c*-4 and between the pixel 501-*c* and the pixel 502-*c*. Furthermore, the partition layer 21-*c*-2 may be formed at a pixel boundary between the pixel 501-*c* and the pixel 502-*c*. The partition layer 29-*c*-1 is formed on the insulating layer 36-*c*-4 and between the pixel 501-*c* and the left pixel (not illustrated) of the pixel 501-*c*. Furthermore, the partition layer 29-*c*-1 may be formed at a pixel boundary between the pixel 501-*c* and a left pixel (not illustrated) of the pixel 501-*c*. The partition layer 29-*c*-3 is formed on the insulating layer 36-*c*-4 and between the pixel 502-*c* and the right pixel (not illustrated) of the pixel 502-*c*. Furthermore, the partition layer 29-*c*-3 may be formed at a pixel boundary between the pixel 502-*c* and a right pixel (not illustrated) of the pixel 502-*c*. The partition layer 29-*c*-2 is configured by a metal layer 31-*c*-2 covered with an oxide film (for example, an insulating film) 30-*c*-2. Furthermore, the partition layer 29-*c*-2 has a two-stage structure, and the width of the first stage (on light incident side) is smaller than the width of the second stage (on the semiconductor substrate side). Note that the partition layer 29-*c*-2 may be configured in a plurality of stages. The partition layer 29-*c*-3 is configured by a metal layer 31-*c*-3 covered with an oxide film (for example, an insulating film) 30-*c*-3. Furthermore, the partition layer 29-*c*-3 has a two-stage structure, and the width of the first stage (on light incident side) is smaller than the width of the second stage (on the semiconductor substrate side). Note that the partition layer 29-*c*-3 may be configured in a plurality of stages. The partition layer 29-*c*-1 is configured by a metal layer (not illustrated) covered with an oxide film (for example, an insulating film) (not illustrated). Furthermore, the partition layer 29-*c*-1 has a two-stage structure, and the width of the first stage (on light incident side) is smaller than the width of the second stage (on the semiconductor substrate side). Note that the partition layer 29-*c*-1 may be configured in a plurality of stages.

In the structure of the partition layers 29-*c*-1 to 29-*c*-3, the width of the lower layer of the second layer (which may be the lower layer of the second stage) is large. Therefore, a movable range for pupil correction of the upper layer of the first layer (which may be the upper layer of the first stage) smaller than the width of the lower layer is expanded. Meanwhile, if the partition width is large (for example, the partition layers 29-*b*-1 to 29-*b*-3), the sensitivity decreases because the aperture becomes narrow. However, in the partition layers 29-*c*-1 to 29-*c*-3, the decrease in sensitivity can be suppressed because the aperture is large.

Figure 5:
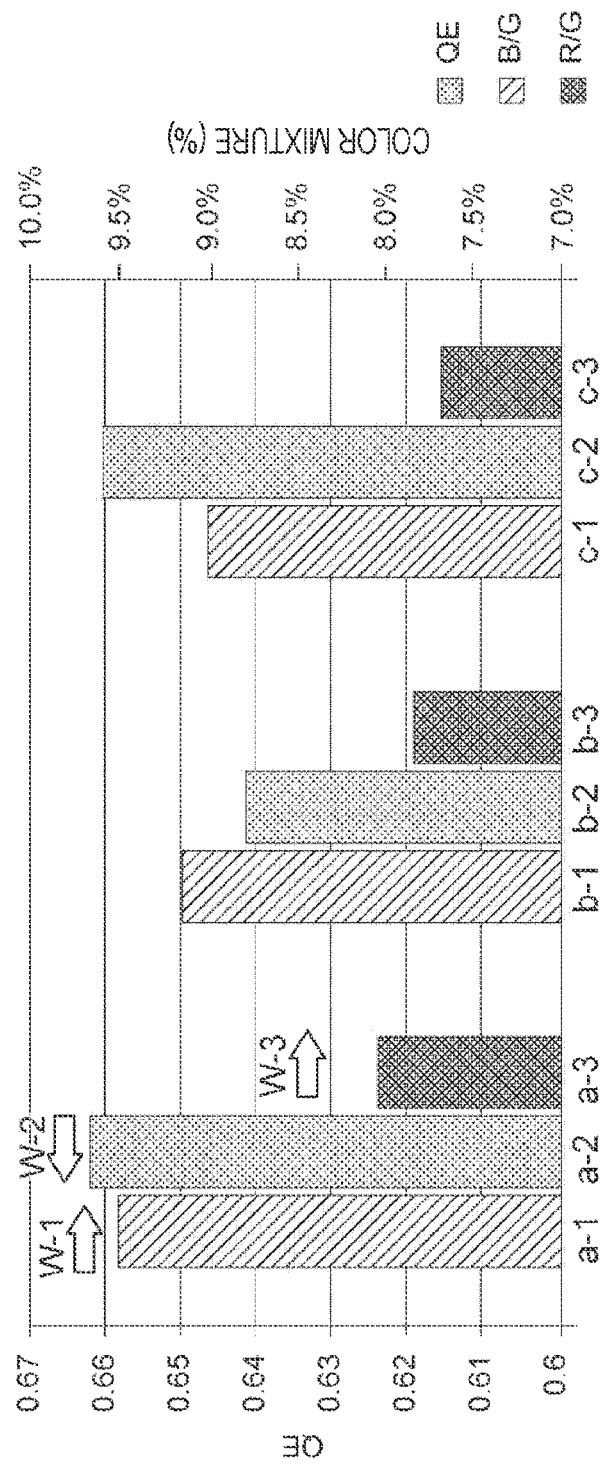
FIG. 5 is a graph illustrating results of sensitivity and color mixture of right-side peripheral pixels of the solid-state imaging device with pupil correction.

FIG. 5 is a graph illustrating results of sensitivity and color mixture of peripheral pixels on the right side of the solid-state imaging device with pupil correction.

FIG. 5 illustrates simulation and comparison results of the sensitivity and color mixture in the case of radiating light with 530 nm and CRA=20 deg among the solid-state imaging devices 500-*a* to 500-*c* illustrated in FIGS. 4A, 4B, and 4C. To describe the details, a-1 illustrated on the horizontal axis in FIG. 5 represents data indicating color mixture (B/G) of blue (B) of the solid-state imaging device 500-*a*, a-2 represents data indicating green (G) pixel sensitivity (QE) of the solid-state imaging device 500-*a*, and a-3 represents data indicating color mixture (R/G)) of red (R) of the solid-state imaging device 500-*a*. b-1 illustrated on the horizontal axis in FIG. 5 represents data indicating color mixture (B/G) of blue (B) of the solid-state imaging device 500-*b*, b-2 represents data indicating green (G) pixel sensitivity of the solid-state imaging device 500-*b*, and b-3 represents data indicating color mixture (R/G)) of red (R) of the solid-state imaging device 500-*b*. c-1 illustrated on the horizontal axis in FIG. 5 represents data indicating color mixture (B/G) of blue (B) of the solid-state imaging device 500-*c*, c-2 represents data indicating green (G) pixel sensitivity of the solid-state imaging device 500-*c*, and c-3 represents data indicating color mixture (R/G)) of red (R) of the solid-state imaging device 500-*c*. The left vertical axis in FIG. 5 represents a green (G) pixel sensitivity value, and the right vertical axis in FIG. 5 represents a color mixture value (%). For example, a-1 (color mixture (B/G)) illustrated on the horizontal axis in FIG. 5 can be read from a value on the right vertical axis (color mixture (%)) in FIG. 5 in the direction of arrow W-1, a-2 (green (G) pixel sensitivity (QE)) illustrated on the horizontal axis in FIG. 5 can be read from a value of the left vertical axis (green (G) pixel sensitivity (QE)) in FIG. 5 in the direction of arrow W-2, and a-3 (color mixture (R/G)) illustrated on the horizontal axis in FIG. 5 can be read from the value on the right vertical axis (color mixture (%)) in FIG. 5 in the direction of arrow W-3. The values of the green (G) pixel sensitivity (QE) and the color mixture ((B/G) and (R/G)) for b-1 to b-3 and c-1 to c-3 illustrated on the horizontal axis in FIG. 5 can be read by a method similar to the above-described method.

The structure of the solid-state imaging device 500-c has substantially the same sensitivity as the structure of the solid-state imaging device 500-a. Furthermore, the structure of the solid-state imaging device 500-c has a characteristic of less color mixture at the time of radiating the light with 530 nm (G light) than the structure of the solid-state imaging device 500-b. According to the above results, it can be said that the solid-state imaging device 500-c can be improved from the comprehensive viewpoint in the sensitivity and color mixture as compared with the solid-state imaging devices 500-a and 500-b.

Figure 6:
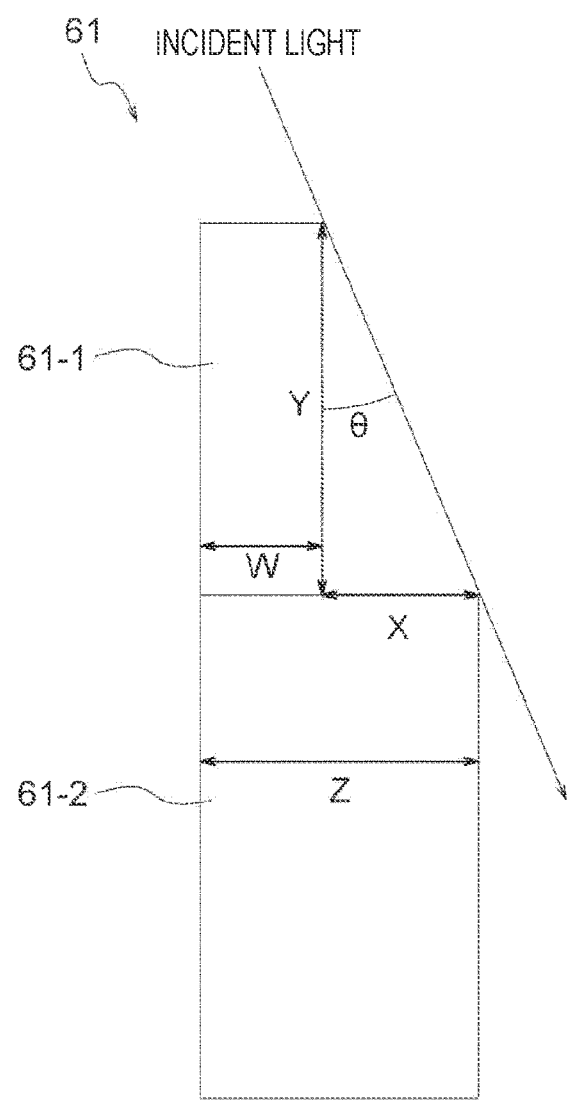
FIG. 6 is a diagram illustrating a relationship between a height of a partition layer and a width of the partition layer.

FIG. 6 is a diagram illustrating a relationship between a height of a partition layer and a width of the partition layer.

A partition layer 61 illustrated in FIG. 6 is formed in a two-layer structure including a first layer (upper layer) 61-1 and a second layer (lower layer) 61-2. The partition layer 61 has a structure in which a width W of the first layer (upper layer) 61-1 on the incident light side is smaller than a width Z of the second layer (lower layer) 61-2. With the structure, the aperture area can be increased. By increasing the aperture area, in the case where oblique light (for example, the incident light in FIG. 6) is radiated on the solid-state imaging device (device) in the peripheral portion of the imaging region or the like, the oblique light being kicked by an end of the partition layer or the like can be suppressed.

Since the relationship between the width of the partition layer and the height of the partition layer needs to satisfy a requirement that incident light is not kicked by the partition layer, the width is only required to satisfy a condition that a difference X between the width Z of the second layer (lower layer) 61-2 and the width W of the first layer (upper layer) becomes smaller than the first layer (upper layer) height Y×tan θ (principal ray angle). That is, it is only required to satisfy the following equation. θ is a principal ray angle.

$$X < Y \tan \theta$$

Note that Y is favorably larger than X.

FIGS. 7A, 7B, 7C, 7D, 7E, 7F, 7G, 7H, 8A, 8B, 8C, 8D, 9A, 9B, 9C, 9D, 9E, 9F, 9G, 9H, 10A, 10B, 10C, 10D, 10E, 10F, 11A, 11B, 11C, 11D, and 11E are cross-sectional views illustrating examples of a method of manufacturing the partition layer provided in the solid-state imaging device according to the first embodiment of the present technology.

First, Example 1 of the method of manufacturing the partition layer will be described with reference to FIGS. 7A, 7B, 7C, 7D, 7E, 7F, 7G 7H, 8A, 8B, 8C, and 8D.

In FIG. 7A, a metal layer 51-a is sputtered or deposited by a CVD method or the like on a Si substrate (semiconductor substrate) 50-a to have a predetermined height (which becomes the height of the second layer (lower layer) excluding the oxide film of the partition layer, for example, 350 nm). Note that a polymer such as a resin may be deposited on the Si substrate (semiconductor substrate) 50-a to produce a partition layer containing the polymer. Thereafter, a resist is applied onto a metal layer 51-b formed on a semiconductor substrate 50-b, and resists 52-b-1 to 52-b-3 are patterned (FIG. 7B). Then, after patterning the resists, etching is performed so that metal layers 51-c-1 to 51-c-3 (resists 52-c-1 to 52-c-3) are formed on a semiconductor substrate 50-c by RIE or the like (FIG. 7C).

The patterned resists 52-c-1 to 52-c-3 illustrated in FIG. 7C are peeled off with an asher or the like, and metal layers 51-d-1 to 51-d-3 are formed on a semiconductor substrate 50-d (FIG. 7D). Oxide films 53-e-1 to 53-e-5 are deposited by about 20 nm by a CVD method or the like on metal layers 51-e-1 to 51-e-5 formed on a Si substrate (semiconductor substrate) 50-e (FIG. 7E), for example. Next, to form a metal layer (metal layer) for the first layer (upper layer) of the partition layer again, a metal layer 54-f for the first layer (upper layer) of the partition layer is deposited by a CVD method, a sputtering method, or the like by 350 nm, for example, on oxide films 53-f-1 to 53-f-5 (FIG. 7F). Note that, as illustrated in FIG. 7F, the oxide film 53-f-1 is formed on a metal layer 51-f-1 on a semiconductor substrate 50-f, the oxide film 53-f-2 is formed on a metal layer 51-f-2 on the semiconductor substrate 50-f, the oxide film 53-f-3 is formed on a metal layer 51-f-3 on the semiconductor substrate 50-f, the oxide film 53-f-4 is formed on the semiconductor substrate 50-f, and the oxide film 53-f-5 is formed on the semiconductor substrate 50-f.

Thereafter, a resist is applied again on a metal layer 54-g, and resists 55-g-1 to 55-g-3 are patterned (FIG. 7G). As illustrated in FIG. 7G, the metal layer 54-g is formed on oxide films 53-g-1 to 53-g-5. The oxide film 53-g-1 is formed on a metal layer 51-g-1 on a semiconductor substrate 50-g, the oxide film 53-g-2 is formed on a metal layer 51-g-2 on the semiconductor substrate 50-g, the oxide film 53-g-3 is formed on a metal layer 51-g-3 on the semiconductor substrate 50-g, the oxide film 53-g-4 is formed on the semiconductor substrate 50-g, and the oxide film 53-g-5 is formed on the semiconductor substrate 50-g.

Thereafter, metal layers 54-h-1 to 54-h-3 (resists 55-h-1 to 55-h-3) for the first layer (upper layer) formed on the second layer (lower layer) (metal layers 51-h-1 to 51-h-3 and oxide films 53-h-1 to 53-h-3 are stacked in this order) formed on a Si substrate (semiconductor substrate) 50-h are processed by RIE or the like (FIG. 7H). As illustrated in FIG. 7H, oxide films 53-h-4 and 53-h-5 are formed on the semiconductor substrate 50-h.

Then, the patterned resists 55-h-1 to 55-h-3 illustrated in FIG. 7H are peeled off with an asher or the like (FIG. 8A). As illustrated in FIG. 8A, metal layers 54-i-1 to 54-i-3 for the first layer (upper layer) are formed on the second layer (lower layer) (metal layers 51-i-1 to 51-i-3 and oxide films 53-i-1 to 53-i-3 are stacked in this order) formed on a Si substrate (semiconductor substrate) 50-i. Then, oxide films 53-i-4 and 53-i-5 are formed on the semiconductor substrate 50-i.

Oxide films 56-j-1 to 56-j-5 are deposited by a CVD method or the like by about 20 nm on metal layers 51-e-1 to 51-e-5 of the first layer (upper layer) to form a desired partition layer (FIG. 8B). In FIG. 8B, a total of three partition layers, that is, a partition layer including the first layer (upper layer) configured by a metal layer 54-j-1 covered with an oxide film 56-j-1 and the second layer (lower layer) configured by a metal layer 51-j-1 covered with an oxide film 53-j-1, a partition layer including the first layer (upper layer) configured by a metal layer 54-j-2 covered with an oxide film 56-j-2 and the second layer (lower layer) configured by a metal layer 51-j-2 covered with an oxide film 53-j-2, and a partition layer including the first layer (upper layer) configured by a metal layer 54-j-3 covered with an oxide film 56-j-3 and the second layer (lower layer) configured by a metal layer 51-*j*-3 covered with an oxide film 53-*j*-3 are formed on a semiconductor substrate 50-*j*.

The three partition layers have a two-layer configuration, as described above, and the center line (the up-down direction in FIG. 8B (not illustrated)) of the first layer (light incident side) is shifted in the left direction in FIG. 8B with respect to the center line (the up-down direction in FIG. 8B (not illustrated)) of the second layer (semiconductor substrate side), and the two apertures (corresponding to color filter (CF) layers 57-*k* and 58-*k* in FIG. 8C) formed by these three partition layers expand in the left direction in FIG. 8B. Therefore, these three partition layers can be applied to, for example, the right-end pixels (right-side peripheral pixels) of the pixel array unit for pupil correction.

Then, thereafter, for example, color filter (CF) layers 57-*k* (for example, a color filter for green) and 58-*k* (for example, a color filter for red) are formed by a known method (FIG. 8C). As illustrated in FIG. 8C, the color filter (CF) layer 57-*k* is arranged between a partition layer including the first layer (upper layer) configured by a metal layer 54-*k*-1 covered with an oxide film 56-*k*-1 and the second layer (lower layer) configured by a metal layer 51-*k*-1 covered with an oxide film 53-*k*-1, and formed on a semiconductor substrate 50-*k*, and a partition layer including the first layer (upper layer) configured by a metal layer 54-*k*-2 covered with an oxide film 56-*k*-2 and the second layer (lower layer) configured by a metal layer 51-*k*-2 covered with an oxide film 53-*k*-2, and formed on the semiconductor substrate 50-*k*. Then, the color filter (CF) layer 58-*k* is arranged between a partition layer including the first layer (upper layer) configured by a metal layer 54-*k*-2 covered with an oxide film 56-*k*-2 and the second layer (lower layer) configured by a metal layer 51-*k*-2 covered with an oxide film 53-*k*-2, and formed on the semiconductor substrate 50-*k*, and a partition layer including the first layer (upper layer) configured by a metal layer 54-*k*-3 covered with an oxide film 56-*k*-3 and the second layer (lower layer) configured by a metal layer 51-*k*-3 covered with an oxide film 53-*k*-3, and formed on the semiconductor substrate 50-*k*.

Thereafter, a flattening layer 60-I is formed on a color filter (CF) layer 57-I (for example, a color filter for green) and a color filter (CF) layer 58-I (for example, a color filter for red), and microlenses 59-I-1 to 59-I-2 are formed on the flattening layer 60-I, by a known method, whereby a solid-state imaging device is manufactured (FIG. 8D).

As illustrated in FIG. 8D, the color filter (CF) layer 57-I is arranged between a partition layer including the first layer (upper layer) configured by a metal layer 54-1-1 covered with an oxide film 56-1-1 and the second layer (lower layer) configured by a metal layer 51-1-1 covered with an oxide film 53-1-1, and formed on a semiconductor substrate 50-I, and a partition layer including the first layer (upper layer) configured by a metal layer 54-1-2 covered with an oxide film 56-1-2 and the second layer (lower layer) configured by a metal layer 51-1-2 covered with an oxide film 53-1-2, and formed on the semiconductor substrate 50-I. Then, the color filter (CF) layer 58-I is arranged between a partition layer including the first layer (upper layer) configured by a metal layer 54-1-2 covered with an oxide film 56-1-2 and the second layer (lower layer) configured by a metal layer 51-1-2 covered with an oxide film 53-1-2, and formed on the semiconductor substrate 50-I, and a partition layer including the first layer (upper layer) configured by a metal layer 54-1-3 covered with an oxide film 56-1-3 and the second layer (lower layer) configured by a metal layer 51-1-3 covered with an oxide film 53-1-3, and formed on the semiconductor substrate 50-I.

Example 2 of the method of manufacturing the partition layer will be described with reference to FIGS. 9A, 9B, 9C, 9D, 9E, 9F, 9G and 9H.

As described in FIGS. 7A, 7B, 7C, 7D, 7E, 7F, 7G, 7H, 8A, 8B, 8C, and 8D, in the partition layer manufactured by Example 1 of the manufacturing method, the oxide film is sandwiched between the partition layers (for example, between the partition layers of the second layer (lower layer) and the first layer (upper layer). In FIGS. 9A, 9B, 9C, 9D, 9E, 9F, 9G, and 9H, a method of manufacturing a partition layer configured in two stages will be described.

For example, a metal layer (metal layer) 63-*a* is deposited on a Si substrate (semiconductor substrate) 62-*a* (FIG. 9A). A resist is applied onto a metal layer 63-*b* formed on a semiconductor substrate 62-*b*, and resists 64-*b*-1 to 64-*b*-3 are patterned (FIG. 9B). After patterning the resists, etching is performed so that metal layers 63-*c*-1 to 63-*c*-4 (resists 64-*c*-1 to 64-*c*-3) are formed on a semiconductor substrate 62-*c* at specified time using RIE (FIG. 9C).

Thereafter, the resists 64-*c*-1 to 64-*c*-3 illustrated in FIG. 9C are peeled off, and metal layers 63-*d*-1 to 63-*d*-4 are formed on a semiconductor substrate 62-*d* (FIG. 9D). Again, a resist is applied on metal layers 63-*e*-1 to 63-*e*-4 formed on a semiconductor substrate 62-*e*, and resists 65-*e*-1 to 65-*e*-7 are patterned (FIG. 9E). Etching is performed by RIE so that metal layers 63-*f*-1 to 63-*f*-3 (resists 65-*f*-1 to 65-*f*-7) are formed on the semiconductor substrate 62-*f* (FIG. 9F). Thereafter, the resists 65-*f*-1 to 65-*f*-7 are peeled off, and a metal layer configured in two stages of 63-*g*-1 and 63-*g*-2, a metal layer configured in two stages of 63-*g*-3 and 63-*g*-4, and a metal layer configured in two stages of 63-*g*-5 and 63-*g*-6, that is, a metal layer configured in the three two stages are formed on a semiconductor substrate 62-*g* (FIG. 9G).

Thereafter, as illustrated in FIG. 9H, an oxide film (for example, a silicon oxide film) 66-*h*-1 is deposited by about 20 nm to cover a metal layer configured in two stages of 63-*h*-1 (second stage) and 63-*h*-2 (first stage) by a CVD method or the like, an oxide film (for example, a silicon oxide film) 66-*h*-2 is deposited by about 20 nm to cover a metal layer configured in two stages of 63-*h*-3 (second stage) and 63-*h*-4 (first stage) by a CVD method or the like, and moreover, an oxide film (for example, a silicon oxide film) 66-*h*-3 is deposited by about 20 nm to cover a metal layer configured in two stages of 63-*h*-5 (second stage) and 63-*h*-6 (first stage) by a CVD method or the like. In FIG. 9H, a partition layer configured in total of three two stages is formed on a semiconductor substrate 62-*h*.

The three partition layers have a two-stage configuration, as described above, and the center line (the up-down direction in FIG. 9H (not illustrated)) of the first stage (light incident side) is shifted in the left direction in FIG. 9H with respect to the center line (the up-down direction in FIG. 9H (not illustrated)) of the second stage (semiconductor substrate side), and the two apertures formed by these three partition layers expand in the left direction in FIG. 9H. Therefore, these three partition layers can be applied to, for example, the right-end pixels (right-side peripheral pixels) of the pixel array unit for pupil correction. Since these three partition layers have a structure having no oxide film or the like between the metal layers or in the metal layer, light leakage can be suppressed in the case where there is light leakage via an oxide film present between the metal layers or in the metal layer.

Example 3 of the method of manufacturing the partition layer having a trapezoidal shape (forward taper shape) will be described with reference to FIGS. 10A 10B 10C 10D 10E and 10F.

The partition layer having a trapezoidal shape has a structure in which the second width on the semiconductor substrate side is large and the first width on the light incident side is small. In the case where the partition layer having a trapezoidal shape has a right-left asymmetric structure, the partition layer is used between peripheral pixels of the pixel array unit (for example, between right-end pixels or between left-end pixels). In the case where the partition layer having a trapezoidal shape has a substantially right-left symmetrical structure, the partition layer is used between the central pixels of the pixel array unit (for example, between center pixels).

As illustrated in FIG. 10A, a metal layer (for example, a metal layer configured by tungsten (W)) 68-a is deposited on a Si substrate (semiconductor substrate) 67-a by a sputtering method or the like. Thereafter, as illustrated in FIG. 10B, a resist 69-b is applied onto a metal layer 68-b formed on a semiconductor substrate 67-b.

Next, patterning is performed using a grating mask so that resist trapezoidal shapes 69-c-1 to 69-c-3 formed on a resist flat portion 69-c-4 are formed (FIG. 10C). Thereby, as illustrated in FIG. 10C, patterning with different resist film thicknesses can be performed in a chip surface (in a semiconductor substrate surface). Note that the grating mask in FIG. 10C is placed on the resist flat portion 69-c-4 and the resist trapezoidal shapes 69-c-1 to 69-c-3 formed on a metal layer 68-c on a semiconductor substrate 67-c.

Next, etch back by RIE is performed, and as illustrated in FIG. 10D, metal layers 68-d-1 to 68-d-3 formed in a central portion of the partition layer can be formed on a semiconductor substrate 67-d. At this time, the respective widths of the metal layers 68-d-1 to 68-d-3 can be made different widths (shapes) according to angles of sides of a recess between the trapezoidal shapes 69-c-1 and 69-c-2 and the length of a bottom side of the recess (the width of the recess), and angles of sides of a recess between the trapezoidal shapes 69-c-2 and 69-c-3 and the length of a bottom side of the recess (the width of the recess). After that, resists 69-d-1 to 69-d-3 are peeled off to form metal layers 68-e-1 to 68-e-3 on a semiconductor substrate 67-e (FIG. 10E), and then an oxide film 69-f is deposited by, for example, 20 nm by a CVD method or the like, whereby a partition layer having a trapezoidal shape configured by a metal layer 68-f-1 covered with an oxide film 69-f, a partition layer having a trapezoidal shape configured by a metal layer 68-f-2 covered with the oxide film 69-f, and a partition layer having a trapezoidal shape configured by a metal layer 68-f-3 covered with the oxide film 69-f, that is, a total of three partition layers are formed, as illustrated in FIG. 10F.

Example 4 of the method of manufacturing the partition layer will be described with reference to FIGS. 11A 11B 11C 11D and 11E.

Example 4 of the method of manufacturing the partition layer is a manufacturing method using a nanoimprint manufacturing method. In the nanoimprint manufacturing method, the partition layer can be manufactured by changing the level of right-left symmetry to right-left asymmetry from the central portion to the peripheral portion (the right end portion or the left end portion of the pixel array unit) of the imaging region (pixel array unit).

First, as illustrated in FIG. 11A, a mold 70-a that reflects desired partition width and desired partition height is prepared. The mold 70-a has, for example, an uneven shape of several tens of nanometers to several hundreds of nanometers. Next, a resin material 72-b to serve as the partition layer is deposited on a Si substrate (semiconductor substrate) 71-b. Note that a metal material (for example, tungsten (W)) may be used instead of the resin material 72-b (FIG. 11B).

Then, as illustrated in FIG. 11C, a mold 70-c is pressed against a resin material to transfer the shape of the mold to the resin material, and resin materials 72-c-1 to 72-c-4 are formed on a semiconductor substrate 71-c. As a result, as illustrated in FIG. 11D, partition layers 72-d-1 to 72-d-4 having a desired shape can be formed on a semiconductor substrate 71-d. Thereafter, as illustrated in FIG. 11E, for example, a color filter layer 73-e-1 (for example, a color filter for red) can be formed on a semiconductor substrate 71-e between a partition layer 72-e-1 and a partition layer 72-e-2, a color filter layer 74-e (for example, a color filter for blue) can be formed on the semiconductor substrate 71-e between the partition layer 72-e-2 and a partition layer 72-e-3, and moreover, a color filter layer 73-e-2 (for example, a color filter for red) can be formed on the semiconductor substrate 71-e between the partition layer 72-e-3 and a partition layer 72-e-4, by a known method.

3. Second Embodiment (Example 2 of Solid-State Imaging Device)

A solid-state imaging device according to a second embodiment (Example 2 of a solid-state imaging device) according to the present technology is a solid-state imaging device including a pixel array unit in which a plurality of pixels is one-dimensionally or two-dimensionally arrayed, the pixel array unit including a color filter and a semiconductor substrate for each pixel, a partition layer being formed between the color filters, the partition layer having a first width and a second width in order from a light incident side, the first width and the second width being different, and the first width being larger than the second width. The first width is a width on the light incident side and is substantially parallel to a surface of the semiconductor substrate. Furthermore, the first width may be substantially parallel to a surface of a flattening layer that may be arranged on the color filter. The second width is a width on the semiconductor substrate side and is substantially parallel to a surface of the semiconductor substrate.

According to the solid-state imaging device of the second embodiment of the present technology, the image quality is improved. In particular, according to the solid-state imaging device of the second embodiment of the present technology, shading can be suppressed, sensitivity reduction can be suppressed, and color mixture can be suppressed.

FIGS. 12A, 12B, and 12C illustrate cross-sectional views of partition layers provided in the solid-state imaging device according to the second embodiment of the present technology. FIG. 12A illustrates a partition layer 5-a-1 and a partition layer 5-a-2 formed between pixels (for example, left-end pixels) in a left peripheral portion of a pixel array unit (imaging region). FIG. 12B illustrates a partition layer 5-b-1 and a partition layer 5-b-2 formed between pixels (for example, central pixels) in a central portion of the pixel array unit (imaging region). FIG. 12C illustrates a partition layer 5-c-1 and a partition layer 5-c-2 formed between pixels (for example, right-end pixels) in a right peripheral portion of the pixel array unit (imaging region).

The partition layer 5-a-1 is arranged on the left side of a color filter 8-a (for example, a color filter for green light) and is configured by a metal layer 7-a-1 covered with oxide films 6-a-1-1 and 6-a-1-2. The partition layer 5-a-1 has a first width d1 larger than a second width d2, has a reverse taper shape, and is asymmetric with respect to a center line L. The refractive index of the oxide films 6-*a*-1-1 and 6-*a*-1-2 is favorably smaller than that of the color filter 8-*a*. According to this favorable mode, light can be totally reflected at an interface between the color filter 8-*a* and the oxide film 6-*a*-1-2.

The partition layer 5-*a*-2 is arranged on the right side of a color filter 8-*a* and is configured by a metal layer 7-*a*-2 covered with oxide films 6-*a*-2-1 and 6-*a*-2-2. The partition layer 5-*a*-2 has a first width d1 larger than a second width d2, has a reverse taper shape, and is asymmetric with respect to a center line L. The refractive index of the oxide films 6-*a*-2-1 and 6-*a*-2-2 is favorably smaller than that of the color filter 8-*a*. According to this favorable mode, light can be totally reflected at an interface between the color filter 8-*a* and the oxide film 6-*a*-2-1.

The partition layers 5-*a*-1 and 5-*a*-2 are shifted in the right direction that is the central portion direction of the imaging region (pixel array unit), and the aperture area (the area on the light-receiving side of the color filter 8-*a*) expands in the right direction, with respect to oblique light Q-a.

The partition layer 5-*b*-1 is arranged on the left side of a color filter 8-*b* (for example, a color filter for green light) and is configured by a metal layer 7-*b*-1 covered with oxide films 6-*b*-1-1 and 6-*b*-1-2. The partition layer 5-*b*-1 has the first width d1 larger than the second width d2, has a reverse taper shape, and is substantially symmetric with respect to the center line L. The refractive index of the oxide films 6-*b*-1-1 and 6-*b*-1-2 is favorably smaller than that of the color filter 8-*b*. According to this favorable mode, light can be totally reflected at an interface between the color filter 8-*b* and the oxide film 6-*b*-1-2.

The partition layer 5-*b*-2 is arranged on the right side of the color filter 8-*b* and is configured by a metal layer 7-*b*-2 covered with oxide films 6-*b*-2-1 and 6-*b*-2-2. The partition layer 5-*b*-2 has the first width d1 larger than the second width d2, has a reverse taper shape, and is substantially symmetric with respect to the center line L. The refractive index of the oxide films 6-*b*-2-1 and 6-*b*-2-2 is favorably smaller than that of the color filter 8-*b*. According to this favorable mode, light can be totally reflected at an interface between the color filter 8-*b* and the oxide film 6-*b*-2-1.

The partition layers 5-*b*-1 and 5-*b*-2 do not shift in the right-left direction, and the aperture area (the area on the light-receiving side of the color filter 8-*b*) does not expand in the right-left direction, with respect to vertical light Q-b.

The partition layer 5-*c*-1 is arranged on the left side of a color filter 8-*c* (for example, a color filter for green light) and is configured by a metal layer 7-*c*-1 covered with oxide films 6-*c*-1-1 and 6-*c*-1-2. The partition layer 7-*c*-1 has a first width d1 larger than a second width d2, has a reverse taper shape, and is asymmetric with respect to a center line L. The refractive index of the oxide films 6-*c*-1-1 and 6-*c*-1-2 is favorably smaller than that of the color filter 8-*c*. According to this favorable mode, light can be totally reflected at an interface between the color filter 8-*c* and the oxide film 6-*c*-1-2.

The partition layer 5-*c*-2 is arranged on the right side of the color filter 8-*c* and is configured by a metal layer 7-*c*-2 covered with oxide films 6-*c*-2-1 and 6-*c*-2-2. The partition layer 5-*c*-2 has a first width d1 larger than a second width d2, has a reverse taper shape, and is asymmetric with respect to a center line L. The refractive index of the oxide films 6-*c*-2-1 and 6-*c*-2-2 is favorably smaller than that of the color filter 8-*c*. According to this favorable mode, light can be totally reflected at an interface between the color filter 8-*c* and the oxide film 6-*c*-2-1.

The partition layers 5-*c*-1 and 5-*c*-2 are shifted in the left direction that is the central portion direction of the imaging region (pixel array unit), and the aperture area (the area on the light-receiving side of the color filter 8-*c*) expands in the left direction, with respect to oblique light Q-c.

Except for what has been described above, the content described in the solid-state imaging device of the first embodiment according to the present technology can be directly applied to the solid-state imaging device of the second embodiment according to the present technology.

4. Third Embodiment (Example of Electronic Apparatus)

An electronic apparatus according to a third embodiment of the present technology is an electronic apparatus equipped with a solid-state imaging element, the solid-state imaging device including a pixel array unit in which a plurality of pixels is one-dimensionally or two-dimensionally arrayed, the pixel array unit including a color filter and a semiconductor substrate for each pixel, a partition layer being formed between the color filters, the partition layer having a first width and a second width in order from a light incident side, and the first width and the second width being different.

For example, an electronic apparatus according to a third embodiment of the present technology is an electronic apparatus equipped with the solid-state imaging device according to the first embodiment or the second embodiment of the present technology.

Figure 13:
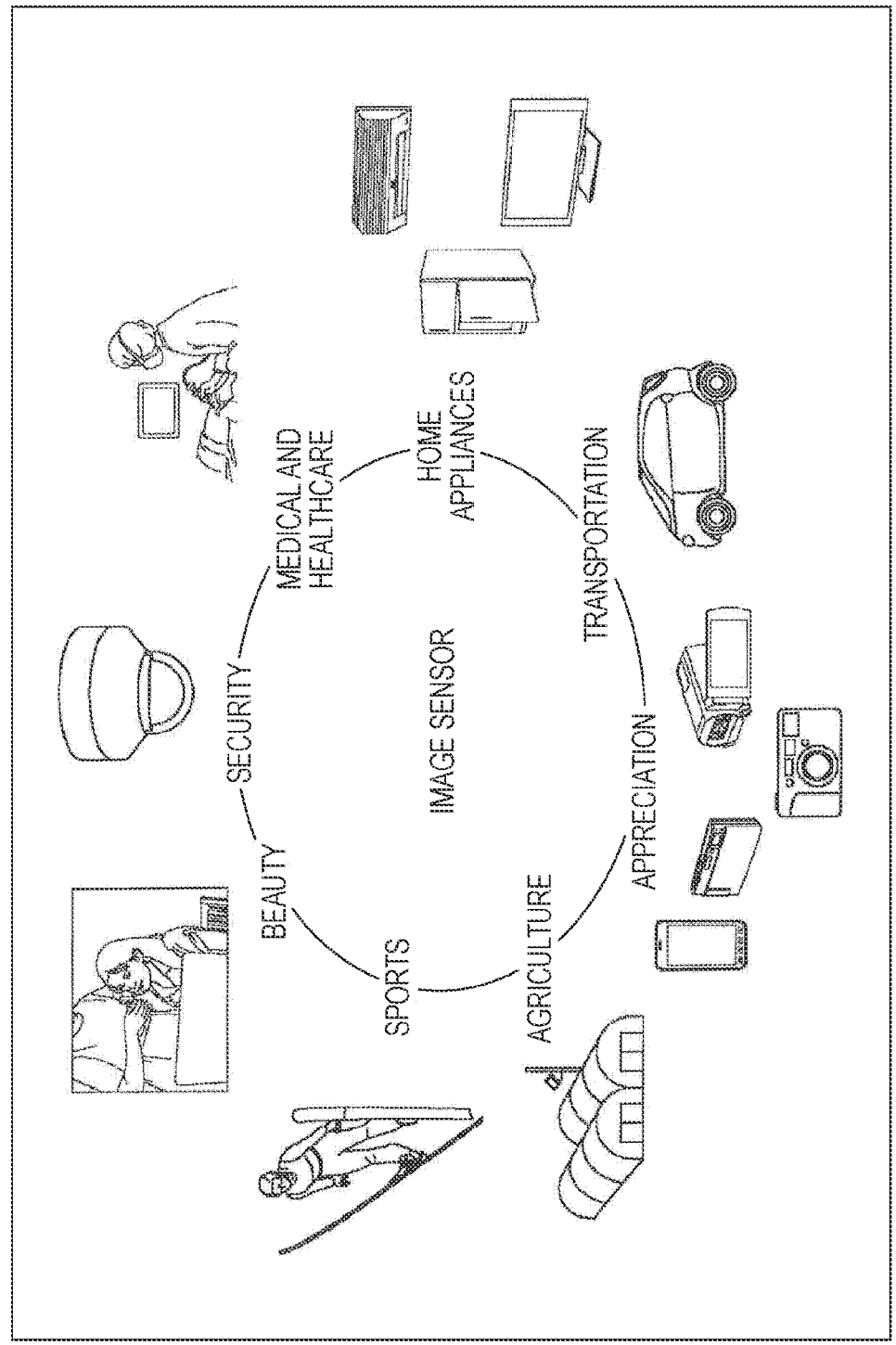
FIG. 13 is a diagram illustrating use examples of the solid-state imaging device of the first or second embodiment to which the present technology is applied.

5. Use Example of Solid-State Imaging Element to which Present Technology is Applied FIG. 13 is a diagram illustrating use examples of the solid-state imaging device according to the first or second embodiment of the present technology as an image sensor.

The above-described solid-state imaging device according to the first or second embodiment can be used in various cases for sensing light such as visible light, infrared light, ultraviolet light, and X-ray, as will be described below, for example. That is, as illustrated in FIG. 13, the solid-state imaging device according to one of the first and second embodiments can be used for an apparatus (for example, as the electronic apparatus according to the third embodiment) in the field of appreciation in which images to be provided for use in appreciation are captured, in the field of transportation, the field of home appliances, the field of medical and healthcare, the field of security, the field of beauty, the field of sports, or the field of agriculture, for example.

Specifically, in the field of appreciation, the solid-state imaging device according to one of the first and second embodiments can be used as a device for capturing an image to be provided for appreciation, such as a digital camera, a smart phone, or a mobile phone device having a camera function, for example.

In the field of transportation, the solid-state imaging device according to one of the first and second embodiments can be used as a device provided for use in traffic, such as an in-vehicle sensor that captures the front, rear, surroundings, an interior, and the like of the vehicle for safe driving such as automatic stop, recognition of a driver's state, a monitoring camera that monitors traveling vehicles and roads, or a distance measuring sensor that measures a distance between vehicles and the like, for example.

In the field of home appliances, the solid-state imaging device according to one of the first and second embodiments can be used as a device provided for home appliances such as a TV receiver, a refrigerator, or an air conditioner, for capturing a gesture of a user and performing a device operation according to the gesture, for example.

In the field of medical and healthcare, the solid-state imaging device according to one of the first and second embodiments can be used as a device provided for use in medical and healthcare, such as an endoscope or a device that performs angiography by receiving infrared light, for example.

In the field of security, the solid-state imaging device according to one of the first and second embodiments can be used as a device provided for use in security, such as a monitoring camera for crime prevention or a camera for person authentication use, for example.

In the field of beauty, for example, the solid-state imaging device according to one of the first and second embodiments can be used as a device provided for use in beauty, such as a skin measuring instrument that captures skin or a microscope that captures scalp, for example.

In the field of sports, the solid-state imaging device according to one of the first and second embodiments can be used as a device provided for use in sports, such as an action camera or a wearable camera for sport use and the like, for example.

In the field of agriculture, the solid-state imaging device according to one of the first and second embodiments can be used as a device provided for use in agriculture, such as a camera for monitoring the condition of fields and crops, for example.

Figure 14:
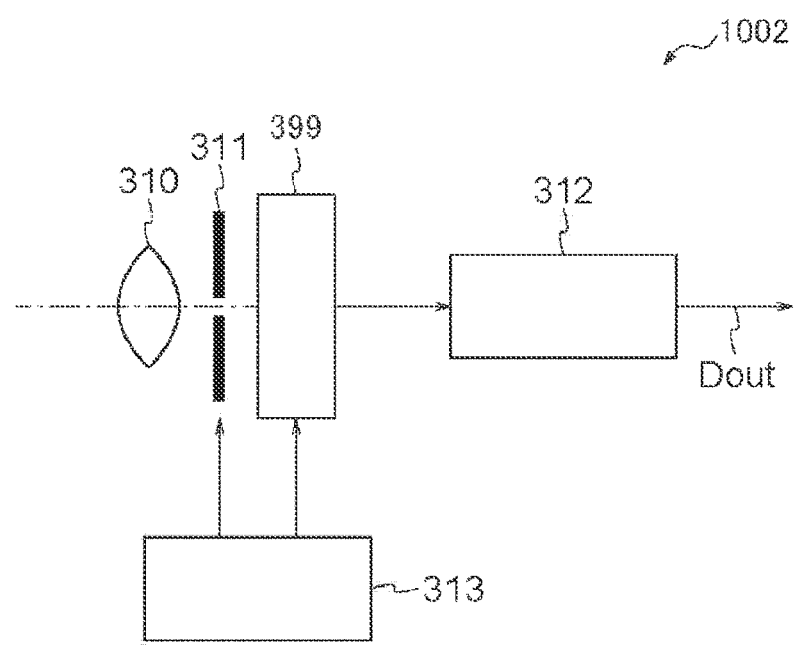
FIG. 14 is a functional block diagram of an example of an electronic apparatus according to a third embodiment to which the present technology is applied.

Next, a specific use example of the solid-state imaging devices according to the first and second embodiments according of the present technology will be described. For example, the above-described solid-state imaging device according to one of the first and second embodiments can be applied to, as a solid-state imaging element 101, every type of electronic device having an imaging function, such as a camera system of a digital still camera, a video camera, or the like, a mobile phone having an imaging function, or the like. FIG. 14 illustrates a schematic configuration of an electronic device 102 (camera) as an example. The electronic device 102 is, for example, a video camera capable of capturing a still image or a moving image, and includes a solid-state imaging element 101, an optical system (optical lens) 310, a shutter device 311, and a drive unit 313 that drives the solid-state imaging element 101 and the shutter device 311, and a signal processing unit 312.

The optical system 310 guides image light (incident light) from an object to a pixel unit 101*a* of the solid-state imaging element 101. The optical system 310 may be configured by a plurality of optical lenses. The shutter device 311 controls a light irradiation period and a light shielding period for the solid-state imaging element 101. The drive unit 313 controls a transfer operation of the solid-state imaging element 101 and a shutter operation of the shutter device 311. The signal processing unit 312 performs various types of signal processing for a signal output from the solid-state imaging element 101. A video signal Dout after the signal processing is stored in a storage medium such as a memory or is output to a monitor or the like.

Note that embodiments according to the present technology are not limited to the above-described embodiments, and various changes can be made without departing from the gist of the present technology.

Furthermore, the effects described in the present specification are merely examples and are not limited, and other effects may be exhibited.

Furthermore, the present technology can also have the following configurations.

[1]

A solid-state imaging device including:
 a pixel array unit in which a plurality of pixels is one-dimensionally or two-dimensionally arrayed, in which
 the pixel array unit includes a color filter and a semiconductor substrate for each pixel,
 a partition layer is formed between the color filters,
 the partition layer has a first width and a second width in order from a light incident side, and
 the first width and the second width are different.

[2]

The solid-state imaging device according to [1], in which the second width is larger than the first width.

[3]

The solid-state imaging device according to [1], in which the first width is larger than the second width.

[4]

The solid-state imaging device according to any one of [1] to [3], in which
 the partition layer includes a plurality of layers in which a layer on the light incident side is an uppermost layer and a layer on an opposite site of the light incident side is a lowermost layer,
 the uppermost layer has a width on the light incident side and a width on the opposite side of the light incident side, and the width on the light incident side of the uppermost layer is the first width, and
 the lowermost layer has a width on the light incident side and a width on the opposite side of the light incident side, and the width on the opposite side of the light incident side of the lowermost layer is the second width.

[5]

The solid-state imaging device according to any one of [1] to [3], in which
 the partition layer includes two layers in which a layer on the light incident side is a first layer and a layer on an opposite side of the light incident side is a second layer,
 the first layer has a width on the light incident side and a width on the opposite side of the light incident side, and the width on the light incident side of the first layer is the first width and the width on the opposite side of the light incident side of the first layer is a third width, and
 the second layer has a width on the light incident side and a width on the opposite side of the light incident side, and the width on the light incident side of the second layer is a fourth width and the width on the opposite side of the light incident side of the second layer is the second width.

[6]

The solid-state imaging device according to any one of [1] to [3], in which
 the partition layer includes a plurality of stages in which a stage on the light incident side is an uppermost stage and a stage on an opposite site of the light incident side is a lowermost stage,
 the uppermost stage has a width on the light incident side and a width on the opposite side of the light incident side, and the width on the light incident side of the uppermost stage is the first width, and the lowermost stage has a width on the light incident side and a width on the opposite side of the light incident side, and the width on the opposite side of the light incident side of the lowermost stage is the second width.

[7]

The solid-state imaging device according to any one of [1] to [3,] in which the partition layer includes two stages in which a stage on the light incident side is a first stage and a stage on an opposite side of the light incident side is a second stage, the first stage has a width on the light incident side and a width on the opposite side of the light incident side, and the width on the light incident side of the first stage is the first width and the width on the opposite side of the light incident side of the first stage is a fifth width, and the second stage has a width on the light incident side and a width on the opposite side of the light incident side, and the width on the light incident side of the second stage is a sixth width and the width on the opposite side of the light incident side of the second stage is the second width.

[8]

The solid-state imaging device according to any one of [1] to [7], in which a cross-sectional shape of the partition layer formed in a central portion of the pixel array unit is substantially right-left symmetrical.

[9]

The solid-state imaging device according to any one of [1] to [8], in which a cross-sectional shape of the partition layer formed in a peripheral portion of the pixel array unit is right-left asymmetrical.

[10]

The solid-state imaging device according to any one of [1] to [9], in which the partition layer includes an oxide film and a metal layer, and the metal layer is covered with the oxide film.

[11]

An electronic apparatus equipped with a solid-state imaging device, the solid-state imaging device including:
a pixel array unit in which a plurality of pixels is one-dimensionally or two-dimensionally arrayed, in which the pixel array unit includes a color filter and a semiconductor substrate for each pixel,
a partition layer is formed between the color filters,
the partition layer has a first width and a second width in order from a light incident side, and
the first width and the second width are different.

REFERENCE SIGNS LIST 1 (1-*a*-2, 1-*a*-2, 1-*b*-1, 1-*b*-2, 1-*c*-1, or 1-*c*-2) Partition layer
4 (4-*a*, 4-*b*, or 4-*c*) Color filter
400 (400-*a* or 400-*b*) or 500 (500-*a*, 500-*b*, or 500-*c*) Solid-state imaging device

The invention claimed is:

1. A solid-state imaging device, comprising:
a pixel array unit that includes:
a plurality of pixels one-dimensionally or two-dimensionally arrayed;
color filters;
a semiconductor substrate; and
a partition layer between the color filters, wherein
the partition layer includes a first layer on a light incident side of the pixel array unit and a second layer on a semiconductor substrate side,
the first layer has a first width on the light incident side and a third width on the semiconductor substrate side,
the second layer has a fourth width on the light incident side and a second width on the semiconductor substrate side,
the second width is different from the first width,
the first layer includes a first metal layer and a first oxide film,
the first oxide film is on the first metal layer,
the second layer includes a second metal layer and a second oxide film, and
the second oxide film is on the second metal layer.

2. The solid-state imaging device according to claim 1, wherein
the first layer on the light incident side is an uppermost layer and the second layer on the semiconductor substrate side is a lowermost layer.

3. The solid-state imaging device according to claim 1, wherein
the partition layer includes a plurality of stages in which a stage on the light incident side is an uppermost stage and a stage on the semiconductor substrate side is a lowermost stage,
the uppermost stage has the first width on the light incident side and a fifth width on the semiconductor substrate side, and
the lowermost stage has a sixth width on the light incident side and the second width on the semiconductor substrate side.

4. The solid-state imaging device according to claim 1, wherein
the partition layer includes two stages in which a stage on the light incident side is a first stage and a stage on the semiconductor substrate side is a second stage,
the first stage has the first width on the light incident side and a fifth width on the semiconductor substrate side, and
the second stage has a sixth width on the light incident side and the second width on the semiconductor substrate side.

5. The solid-state imaging device according to claim 1, wherein a cross-sectional shape of the partition layer in a central portion of the pixel array unit is substantially right-left symmetrical.

6. The solid-state imaging device according to claim 1, wherein a cross-sectional shape of the partition layer in a peripheral portion of the pixel array unit is right-left asymmetrical.

7. An electronic apparatus, comprising:
a solid-state imaging device that includes:
a pixel array unit that includes:
a plurality of pixels one-dimensionally or two-dimensionally arrayed;
color filters;
a semiconductor substrate; and
a partition layer between the color filters, wherein
the partition layer includes a first layer on a light incident side of the pixel array unit and a second layer on a semiconductor substrate side,
the first layer has a first width on the light incident side and a third width on the semiconductor substrate side,
the second layer has a fourth width on the light incident side and a second width on the semiconductor substrate side,
the second width is different from the first width, the first layer includes a first metal layer and a first oxide film,
the first oxide film is on the first metal layer,
the second layer includes a second metal layer and a second oxide film, and
the second oxide film is on the second metal layer.

\* \* \* \* \*